United States Patent
Klug et al.

(10) Patent No.: US 12,244,786 B2
(45) Date of Patent: Mar. 4, 2025

(54) HIGH DENSITY PIXEL ARRAYS FOR AUTO-VIEWED 3D DISPLAYS

(71) Applicant: GOOGLE LLC, Mountain View, CA (US)

(72) Inventors: Michael Anthony Klug, Austin, TX (US); Gang He, Cupertino, CA (US); Richard Schneider, Sunnyvale, CA (US); James Richard Dodd, Palo Alto, CA (US); Craig Peters, Fremont, CA (US)

(73) Assignee: GOOGLE LLC, Mountain View, CA (US)

( * ) Notice: Subject to any disclaimer, the term of this patent is extended or adjusted under 35 U.S.C. 154(b) by 282 days.

(21) Appl. No.: 17/558,415

(22) Filed: Dec. 21, 2021

(65) Prior Publication Data

US 2022/0201275 A1    Jun. 23, 2022

Related U.S. Application Data

(60) Provisional application No. 63/128,686, filed on Dec. 21, 2020.

(51) Int. Cl.
*H04N 13/365* (2018.01)
*G02B 30/27* (2020.01)
(Continued)

(52) U.S. Cl.
CPC .......... *H04N 13/365* (2018.05); *G02B 30/27* (2020.01); *H04N 13/305* (2018.05); *H04N 13/383* (2018.05)

(58) Field of Classification Search
CPC .. H04N 13/365; H04N 13/305; H04N 13/383; H04N 13/32; G02B 30/27
See application file for complete search history.

(56) References Cited

U.S. PATENT DOCUMENTS

| 2,403,731 A | 7/1946 | MacNeille |
| 3,936,817 A | 2/1976 | Levy et al. |

(Continued)

FOREIGN PATENT DOCUMENTS

| CN | 112014978 A | 12/2020 |
| EP | 0658870 A2 | 6/1995 |

(Continued)

OTHER PUBLICATIONS

"2114A 1024 x4 Bit Static RAM", Component Data Catalog, Intel Corp., Santa Clara, CA, USA, 1982, 7 pages.
(Continued)

*Primary Examiner* — Paisley L Wilson
*Assistant Examiner* — Agnes Dobrowolski
(74) *Attorney, Agent, or Firm* — Brake Hughes Bellermann LLP

(57) ABSTRACT

A display device based on micro light emitting diodes (microLEDs) includes a plurality of chiplets. Each chiplet includes one or more raxels, each raxel including a plurality of microLEDs supported on a substrate. The chiplet also includes a micro integrated circuit (microIC) electronically connected with the one or more raxels. MicroIC includes a plurality of interconnects supported on a backplane such that, when connected with the raxel, microIC may be used to electrically drive each one of the MicroLED of the raxel. In an embodiment, a plurality of chiplets are disposed on a display substrate to for an auto-view horizontal parallax only 3D display.

21 Claims, 15 Drawing Sheets

(51) Int. Cl.
*H04N 13/305* (2018.01)
*H04N 13/383* (2018.01)

(56) References Cited

U.S. PATENT DOCUMENTS

| | | |
|---|---|---|
| 4,432,610 A | 2/1984 | Kobayashi et al. |
| 4,825,201 A | 4/1989 | Watanabe et al. |
| 4,923,285 A | 5/1990 | Ogino et al. |
| 4,996,523 A | 2/1991 | Bell et al. |
| 5,018,838 A | 5/1991 | Barnes et al. |
| 5,144,418 A | 9/1992 | Brown et al. |
| 5,157,387 A | 10/1992 | Momose et al. |
| 5,189,406 A | 2/1993 | Humphries et al. |
| 5,317,334 A | 5/1994 | Sano |
| 5,359,342 A | 10/1994 | Nakai et al. |
| 5,471,225 A | 11/1995 | Parks |
| 5,473,338 A | 12/1995 | Prince et al. |
| 5,497,172 A | 3/1996 | Doherty et al. |
| 5,537,128 A | 7/1996 | Keene et al. |
| 5,548,347 A | 8/1996 | Melnik et al. |
| 5,566,010 A | 10/1996 | Ishii et al. |
| 5,602,559 A | 2/1997 | Kimura |
| 5,619,228 A | 4/1997 | Doherty |
| 5,731,802 A | 3/1998 | Aras et al. |
| 5,751,264 A | 5/1998 | Cavallerano et al. |
| 5,767,832 A | 6/1998 | Koyama et al. |
| 5,818,413 A | 10/1998 | Hayashi et al. |
| 5,905,482 A | 5/1999 | Hughes et al. |
| 5,926,158 A | 7/1999 | Yoneda et al. |
| 5,926,162 A | 7/1999 | Wood et al. |
| 5,936,603 A | 8/1999 | Lippmann et al. |
| 5,936,604 A | 8/1999 | Endou |
| 5,945,972 A | 8/1999 | Okumura et al. |
| 5,959,598 A | 9/1999 | McKnight |
| 5,969,512 A | 10/1999 | Matsuyama |
| 5,969,701 A | 10/1999 | Numao et al. |
| 5,986,640 A | 11/1999 | Baldwin et al. |
| 6,005,558 A | 12/1999 | Hudson et al. |
| 6,034,659 A | 3/2000 | Wald et al. |
| 6,046,716 A | 4/2000 | McKnight |
| 6,067,065 A | 5/2000 | Worley et al. |
| 6,121,948 A | 9/2000 | Worley et al. |
| 6,127,991 A | 10/2000 | Uehara et al. |
| 6,144,356 A | 11/2000 | Weatherford et al. |
| 6,151,011 A | 11/2000 | Worley et al. |
| RE37,056 E | 2/2001 | Wortel et al. |
| 6,201,521 B1 | 3/2001 | Doherty |
| 6,262,703 B1 | 7/2001 | Perner |
| 6,285,360 B1 | 9/2001 | Li |
| 6,297,788 B1 | 10/2001 | Shigeta et al. |
| 6,317,112 B1 | 11/2001 | Handschy et al. |
| 6,369,782 B2 | 4/2002 | Shigeta |
| 6,424,330 B1 | 7/2002 | Johnson |
| 6,456,267 B1 | 9/2002 | Sato et al. |
| 6,476,792 B2 | 11/2002 | Hattori et al. |
| 6,518,945 B1 | 2/2003 | Pinkham |
| 6,567,138 B1 | 5/2003 | Krusius et al. |
| 6,587,084 B1 | 7/2003 | Alymov et al. |
| 6,603,452 B1 | 8/2003 | Serita |
| 6,621,488 B1 | 9/2003 | Takeuchi et al. |
| 6,690,432 B2 | 2/2004 | Janssen et al. |
| 6,717,561 B1 | 4/2004 | Pfeiffer et al. |
| 6,731,306 B2 | 5/2004 | Booth et al. |
| 6,744,415 B2 | 6/2004 | Waterman et al. |
| 6,762,739 B2 | 7/2004 | Bone |
| 6,784,898 B2 | 8/2004 | Lee et al. |
| 6,788,231 B1 | 9/2004 | Hsueh |
| 6,806,871 B1 | 10/2004 | Yasue |
| 6,831,626 B2 | 12/2004 | Nakamura et al. |
| 6,850,216 B2 | 2/2005 | Akimoto et al. |
| 6,862,012 B1 | 3/2005 | Funakoshi et al. |
| 6,924,824 B2 | 8/2005 | Adachi et al. |
| 6,930,667 B1 | 8/2005 | Ijima et al. |
| 6,930,692 B1 | 8/2005 | Coker et al. |
| 7,066,605 B2 | 6/2006 | Dewald et al. |
| 7,067,853 B1 | 6/2006 | Yao |
| 7,088,325 B2 | 8/2006 | Ishii |
| 7,088,329 B2 | 8/2006 | Hudson |
| 7,129,920 B2 | 10/2006 | Chow |
| 7,187,355 B2 | 3/2007 | Tam et al. |
| 7,379,043 B2 | 5/2008 | Worley et al. |
| 7,397,980 B2 | 7/2008 | Frisken |
| 7,443,374 B2 | 10/2008 | Hudson |
| 7,468,717 B2 | 12/2008 | Hudson |
| 7,692,671 B2 | 4/2010 | Ng |
| 7,852,307 B2 | 12/2010 | Hudson |
| 7,990,353 B2 | 8/2011 | Chow |
| 8,040,311 B2 | 10/2011 | Hudson et al. |
| 8,111,271 B2 | 2/2012 | Hudson et al. |
| 8,264,507 B2 | 9/2012 | Hudson et al. |
| 8,421,828 B2 | 4/2013 | Hudson et al. |
| 8,520,114 B2 | 8/2013 | Cok et al. |
| 8,643,681 B2 | 2/2014 | Endo et al. |
| 9,047,818 B1 | 6/2015 | Day et al. |
| 9,117,746 B1 | 8/2015 | Clark et al. |
| 9,406,269 B2 | 8/2016 | Lo et al. |
| 9,583,031 B2 | 2/2017 | Hudson et al. |
| 9,824,619 B2 | 11/2017 | Hudson et al. |
| 9,918,053 B2 | 3/2018 | Lo et al. |
| 10,437,402 B1 | 10/2019 | Pan |
| 10,957,272 B2 | 3/2021 | Li et al. |
| 2001/0013844 A1 | 8/2001 | Shigeta |
| 2002/0024481 A1 | 2/2002 | Kawabe et al. |
| 2002/0041266 A1 | 4/2002 | Koyama et al. |
| 2002/0043610 A1 | 4/2002 | Lee et al. |
| 2002/0135309 A1 | 9/2002 | Okuda |
| 2002/0140662 A1 | 10/2002 | Igarashi |
| 2002/0158825 A1 | 10/2002 | Endo et al. |
| 2003/0058195 A1 | 3/2003 | Adachi et al. |
| 2003/0156102 A1 | 8/2003 | Kimura |
| 2003/0174117 A1 | 9/2003 | Crossland et al. |
| 2003/0210257 A1 | 11/2003 | Hudson et al. |
| 2004/0032636 A1 | 2/2004 | Willis |
| 2004/0080482 A1 | 4/2004 | Magendanz et al. |
| 2004/0125090 A1 | 7/2004 | Hudson |
| 2004/0174328 A1 | 9/2004 | Hudson |
| 2005/0001794 A1 | 1/2005 | Nakanishi et al. |
| 2005/0001806 A1 | 1/2005 | Ohmura |
| 2005/0052437 A1 | 3/2005 | Hudson |
| 2005/0057466 A1 | 3/2005 | Sala et al. |
| 2005/0062765 A1 | 3/2005 | Hudson |
| 2005/0088462 A1 | 4/2005 | Borel |
| 2005/0195894 A1 | 9/2005 | Kim et al. |
| 2005/0200300 A1 | 9/2005 | Yumoto |
| 2005/0264586 A1 | 12/2005 | Kim |
| 2006/0012589 A1 | 1/2006 | Hsieh et al. |
| 2006/0012594 A1 | 1/2006 | Worley et al. |
| 2006/0066645 A1 | 3/2006 | Ng |
| 2006/0147146 A1 | 7/2006 | Voigt et al. |
| 2006/0208961 A1 | 9/2006 | Nathan et al. |
| 2006/0284903 A1 | 12/2006 | Ng |
| 2006/0284904 A1 | 12/2006 | Ng |
| 2007/0252855 A1 | 11/2007 | Hudson |
| 2007/0252856 A1 | 11/2007 | Hudson et al. |
| 2008/0007576 A1 | 1/2008 | Ishii et al. |
| 2008/0088613 A1 | 4/2008 | Hudson et al. |
| 2008/0158437 A1 | 7/2008 | Arai et al. |
| 2008/0259019 A1 | 10/2008 | Ng |
| 2009/0027360 A1 | 1/2009 | Kwan et al. |
| 2009/0027364 A1 | 1/2009 | Kwan et al. |
| 2009/0115703 A1 | 5/2009 | Cok |
| 2009/0284671 A1 | 11/2009 | Leister |
| 2009/0303248 A1 | 12/2009 | Ng |
| 2010/0073270 A1 | 3/2010 | Ishii et al. |
| 2010/0214646 A1 | 8/2010 | Sugimoto et al. |
| 2010/0253995 A1 | 10/2010 | Reichelt |
| 2010/0295836 A1 | 11/2010 | Matsumoto et al. |
| 2011/0109299 A1 | 5/2011 | Chaji et al. |
| 2011/0109670 A1 | 5/2011 | Sempel et al. |
| 2011/0199405 A1 | 8/2011 | Dallas et al. |
| 2011/0205100 A1 | 8/2011 | Bogaerts |
| 2011/0227887 A1 | 9/2011 | Dallas et al. |
| 2012/0086733 A1 | 4/2012 | Hudson et al. |
| 2012/0113167 A1 | 5/2012 | Margerm et al. |

(56) References Cited

U.S. PATENT DOCUMENTS

| | | | |
|---|---|---|---|
| 2012/0307123 A1* | 12/2012 | Cok | H01L 27/14603 |
| | | | 348/333.01 |
| 2013/0038585 A1 | 2/2013 | Kasai | |
| 2013/0113783 A1 | 5/2013 | Pourbigharaz | |
| 2013/0293955 A1 | 11/2013 | Yang et al. | |
| 2013/0308057 A1 | 11/2013 | Lu et al. | |
| 2014/0085426 A1 | 3/2014 | Leone et al. | |
| 2014/0092105 A1 | 4/2014 | Guttag et al. | |
| 2015/0245038 A1 | 8/2015 | Clatanoff et al. | |
| 2016/0203801 A1 | 7/2016 | De Groot et al. | |
| 2016/0234487 A1 | 8/2016 | Kroon et al. | |
| 2016/0365055 A9 | 12/2016 | Hudson et al. | |
| 2017/0208319 A1 | 7/2017 | Kim et al. | |
| 2017/0338542 A1* | 11/2017 | Cok | H01Q 1/2225 |
| 2018/0024384 A1* | 1/2018 | Tadokoro | G02C 13/00 |
| | | | 351/204 |
| 2018/0061302 A1 | 3/2018 | Hu et al. | |
| 2019/0066608 A1 | 2/2019 | Wantanabe | |
| 2019/0198561 A1 | 6/2019 | Wildeson et al. | |
| 2019/0333443 A1* | 10/2019 | He | G02B 30/10 |
| 2019/0347994 A1 | 11/2019 | Lin et al. | |
| 2020/0014904 A1* | 1/2020 | Wetzstein | H04N 13/15 |
| 2020/0098307 A1 | 3/2020 | Li et al. | |
| 2020/0105653 A1* | 4/2020 | Elsherbini | H01L 24/02 |
| 2021/0201771 A1 | 7/2021 | Li et al. | |
| 2022/0231006 A1 | 7/2022 | Diao et al. | |

FOREIGN PATENT DOCUMENTS

| | | |
|---|---|---|
| EP | 1187087 A1 | 3/2002 |
| GB | 2327798 A | 2/1999 |
| JP | 7049663 A | 2/1995 |
| JP | 2002116741 A | 4/2002 |
| JP | 2012089820 A | 5/2012 |
| JP | 2014527321 A | 10/2014 |
| JP | 2016539381 A | 12/2016 |
| TW | 227005 B | 7/1994 |
| TW | 407253 B | 10/2000 |
| TW | 418380 B | 1/2001 |
| TW | 482991 B | 4/2002 |
| TW | 483282 B | 4/2002 |
| TW | 200603192 A | 1/2006 |
| WO | 0070376 A1 | 11/2000 |
| WO | 0152229 A1 | 7/2001 |
| WO | 2007127849 A2 | 11/2007 |
| WO | 2007127852 A2 | 11/2007 |
| WO | 2020128314 A1 | 6/2020 |

OTHER PUBLICATIONS

Amon, et al., "PTAT Sensors Based on SJFETs", 10th Mediterranean Electrotechnical Conference, MEleCon, vol. II, 2000, pp. 802-805.

Anderson, et al., "Holographic Data Storage: Science Fiction or Science Fact", Akonia Holographics LLC, presented at Optical Data Storage, 2014, 8 pages.

Armitage, et al., "Introduction to Microdisplays", John Wiley & Sons, 2006, pp. 182-185.

"Sony 3D", screen capture from video clip, 2009, 2 pages.

Baker, "CMOS Circuit Design, Layout, and Simulation", IEEE Press Series on Microelectronic Systems, John Wiley & Sons, Inc., Publication, 2010, pp. 614-616.

Campardo, et al., "VLSI-Design of Non-Volatile Memories", Springer, 2005, pp. 183-188.

Colgan, et al., "On-Chip Metallization Layers for Reflective Light Waves", Journal of Research Development, vol. 42, No. 3/4, May-Jul. 1998, pp. 339-345.

CSE370, "Flip-Flops", Lecture 14, https://studylib.net/doc/18055423/flip-flops, no date, pp. 1-17.

Dai, et al., "Characteristics of LCoS Phase-only spatial light modulator and its applications", Optics Communications vol. 238, especially section 3.2, 2004, pp. 269-276.

Drabik, "Optically Interconnected Parallel Processor Arrays", A Thesis, Georgia Institute of Technology, Dec. 1989, pp. 121-126.

Fuller, "Static Random Access Memory—SRAM", Rochester Institute of technology to Microelectronic Engineering, Nov. 18, 2016, pp. 1-39.

Hu, "Complementary MOS (CMOS) Technology", Feb. 13, 2009, pp. 198-200.

Jesacher, et al., "Broadband suppression of the zero diffraction order of an SLM using its extended phase modulation range", Optics Express, vol. 22, No. 14, Jul. 14, 2014, pp. 17590-17599.

Kang, et al., "Digital Driving of TN-LC for WUXGA LCOS Panel", Digest of Technical Papers, Society for Information Display, 2001, pp. 1264-1267.

Nakamura, et al., "Modified drive method for OCB LSD", Proceeding of the International Display Research Conference, Society for Information Display, Campbell, CA, US, 1997, 4 pages.

Ong, "Modern Mos Technology: Processes, Devices, and Design", McGraw-Hill Book Company, 1984, pp. 207-212.

Oton, et al., "Multipoint phase calibration for improved compensation of inherent wavefront distortion in parallel aligned liquid crystal on silicon display", Applied Optics, vol. 46, No. 23, Optical Society of America, 2007, pp. 5667-5679.

Pelgrom, et al., "Matching Properties of MOS Transistors", IEEE Journal of Solid-State Circuits, vol. 23, No. 5, Oct. 1989, 8 pages.

Potter, et al., "Optical correlation using a phase-only liquid crystal over silicon spatial light modulator", SPIE 1564 Opt. Info. Proc. Sys & Arch. III;, 1991, pp. 363-372.

Product Description, "Westar's Microdisplay Inspection System", www.westar.com/mdis, Jan. 2000, 2 pages.

Rabaey, et al., "Digital Integrated Circuits", A Design Perspective, Second Edition, Saurabh Printers Pvt. Ltd, 2016, pp. 138-140.

Rabaey, "The Devices Chapter 3", Jan. 18, 2002, pp. 121-124.

Robinson, et al., "Polarization Engineering for LCD Projection", John Wiley and Sons, Ltd., Chichester, England, 2005, pp. 121-123.

Sloof, et al., "An Improved WXGA LCOS Imager for Single Panel Systems", Proceedings of the Asia Symposium on Information Display, Society for Information Display, Campbell, CA, US, 2004, 4 pages.

SMPTE 274M-2005, "1920×1080 Image Sample Structure, Digital Representation and Digital Timing Reference Sequences for Multiple Picture Rates", SMPTE, White Plains, New York, US, 2005, 29 pages.

Underwood, et al., "Evaluation of an nMOS VLSI array for an adaptive liquid-crystal spatial light modulator", IEEE Proc, v.133 Pl.J. No., Feb. 1986, 15 pages.

Wang, "Studies of Liquid Crystal Response Time", University of Central Florida, Doctoral Dissertation, 2005, 128 pages.

Wu, "Discussion #9 MOSFETs", University of California at Berkeley College of Engineering Department of Electrical Engineering and Computer Sciences, Spring 2008, pp. 1-7.

International Patent Application No. PCT/US2021/064650, International Search Report and Written Opinion dated Mar. 17, 2022, 10 pages.

* cited by examiner

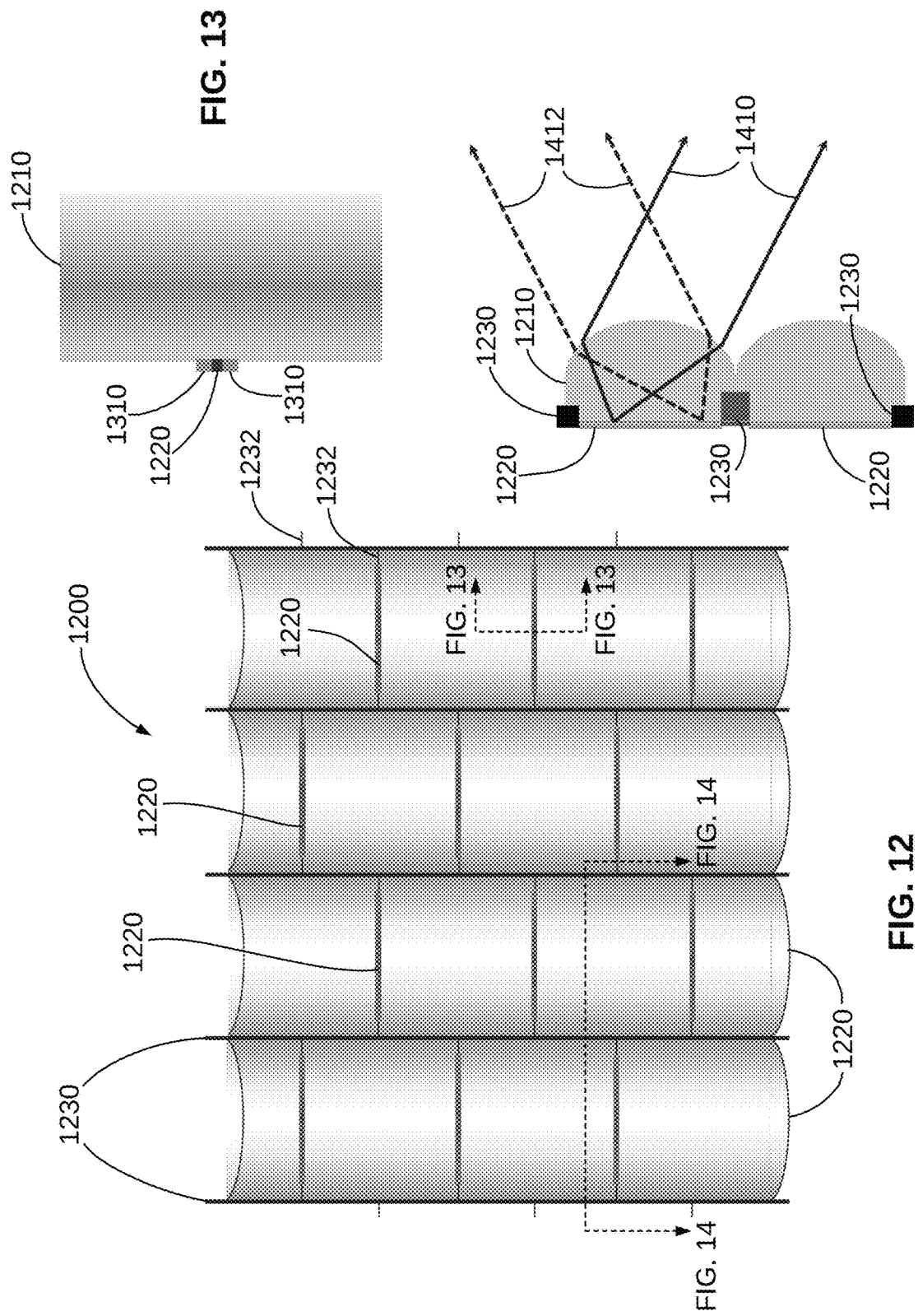

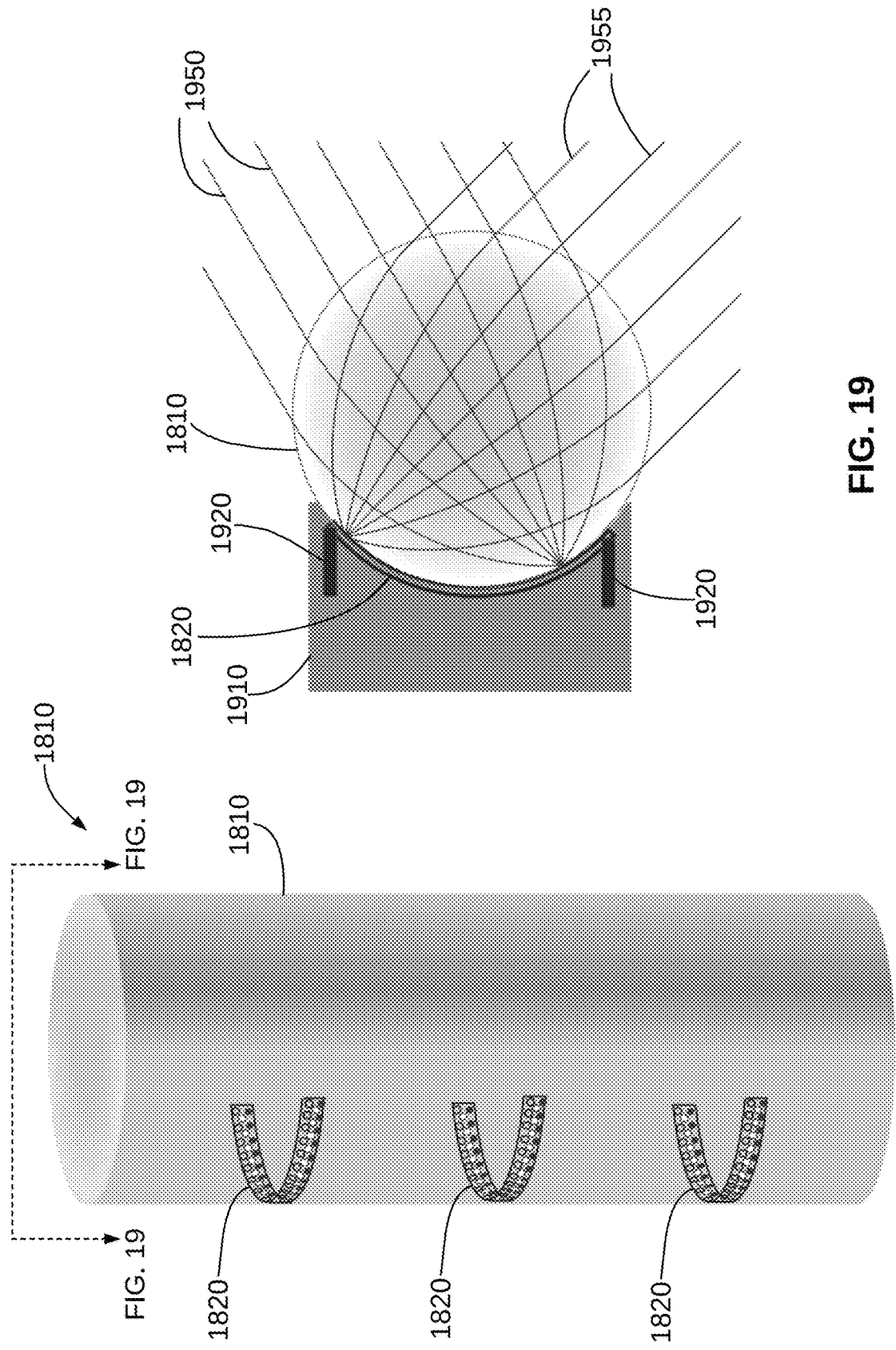

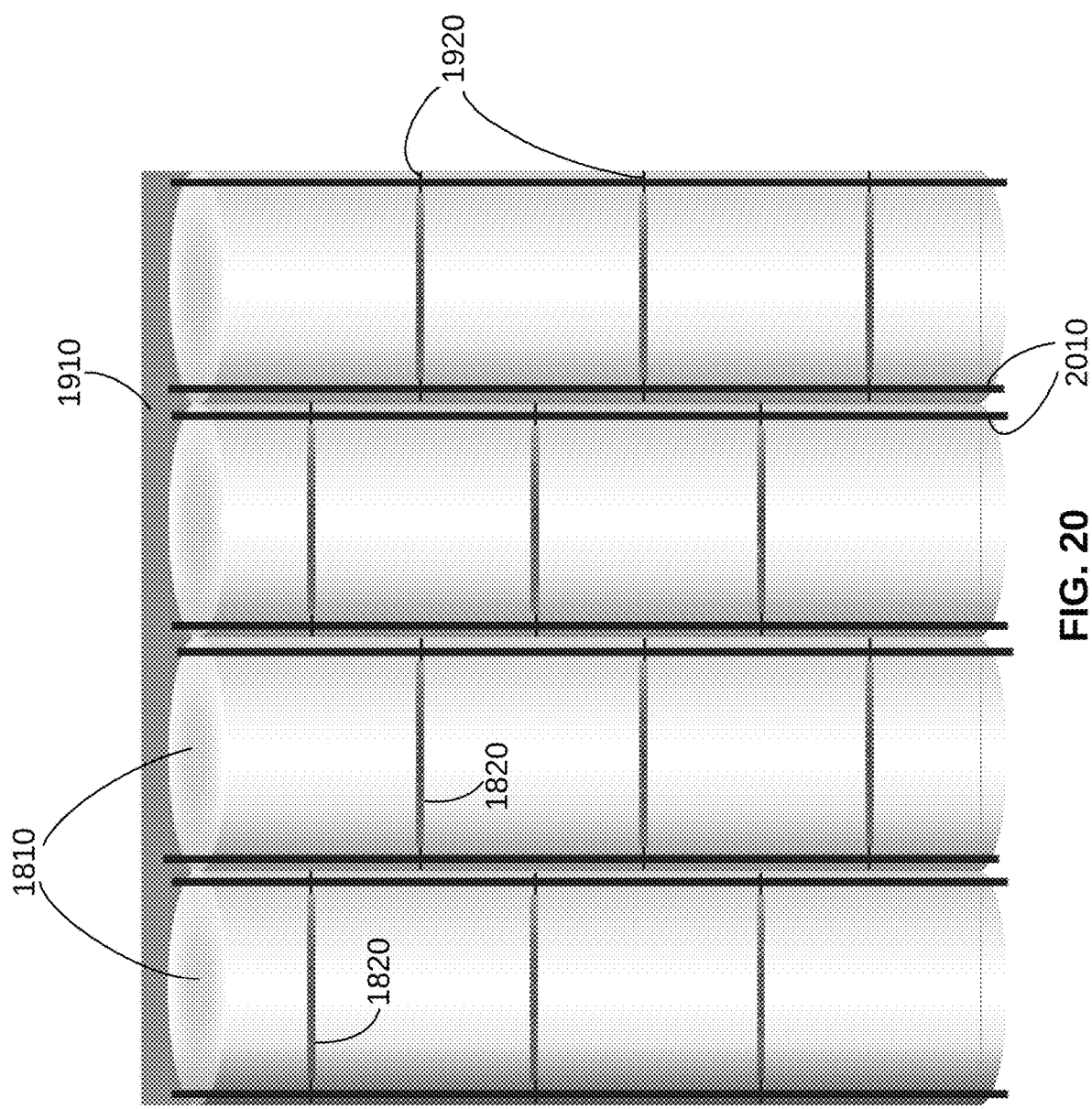

HIGH DENSITY PIXEL ARRAYS FOR AUTO-VIEWED 3D DISPLAYS

CROSS-REFERENCE TO RELATED APPLICATIONS

This application claims priority to U.S. Provisional Patent Application No. 63/128,686 filed Dec. 21, 2020, the content of which is incorporated herein by reference in its entirety.

BACKGROUND

Various types of displays offering autostereoscopic (i.e., viewable without glasses or near-eye optics, or "auto-viewed") three-dimensional (3D) displays have been suggested. One class of such an auto-viewed 3D display is referred to as a horizontal parallax-only (HPO) display, lenticular display, raster barrier display, or parallax barrier display, incorporating various means of separating the distinct parallax views in one dimension (e.g., horizontally). This class of displays incorporates apertures or lenses to multiplex two-dimensional (2D) pixel arrays into specific and limited visibility angles, thus enabling presentation of distinct parallax or animation sequence scene views to each eye. For example, the number of discrete parallax view channels is determined by the field angle of the lenticular lens used within the display, the separation between the pixels and the lens or aperture, the width of the lens or aperture, and the size of the pixels. Some examples of existing auto-viewed 3D displays are described in US Patent Publication No. 2016/0234487 A1 to Kroon et al. and 2017/0208319 A1 to Kim et al.

When the distribution of views is limited to the horizontal direction, the number of distinct samples in the pixel layer in the horizontal direction is greater than that in the vertical direction by at least a factor of two, and as much as a factor of a hundred or more. Standard display technologies, such as those based on organic light emitting diode (OLED) or transmissive liquid crystal (LC) technology, are limited in the minimum size of pixels, and consequently the size of lenses or inter-aperture spacings, because the pixel size is constrained by the required display brightness and practical pixel-driver circuit size. Some tradeoffs have been exploited by using tilted lenticular lenses (see Kroon et al., cited above) and pixels from several vertical rows (see Kim et al., cited above) to increase the number of horizontal angles and the span of distribution while potentially reducing crosstalk, albeit at the expense of display vertical resolution.

A solution to overcome such problems with existing display systems would be desirable.

SUMMARY OF THE DISCLOSURE

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

In an embodiment, a display device based on micro light emitting diodes (microLEDs) includes a plurality of chiplets. Each chiplet includes one or more raxels, each raxel including a plurality of microLEDs supported on a substrate. The chiplet also includes a micro integrated circuit (microIC) electronically connected with the one or more raxels. MicroIC includes a plurality of interconnects supported on a backplane such that, when connected with the raxel, microIC may be used to electrically drive each one of the microLEDs of the raxel. In an embodiment, a plurality of chiplets are disposed on a display substrate to for an auto-view horizontal parallax only 3D display.

BRIEF DESCRIPTION OF THE DRAWINGS

The appended drawings illustrate only some implementations and are therefore not to be considered limiting of scope.

FIGS. 12-14 illustrate another exemplary display system configuration, in accordance with an embodiment.

FIGS. 18-20 illustrate yet another display system configuration, in accordance with an embodiment.

DETAILED DESCRIPTION

Figure 1:
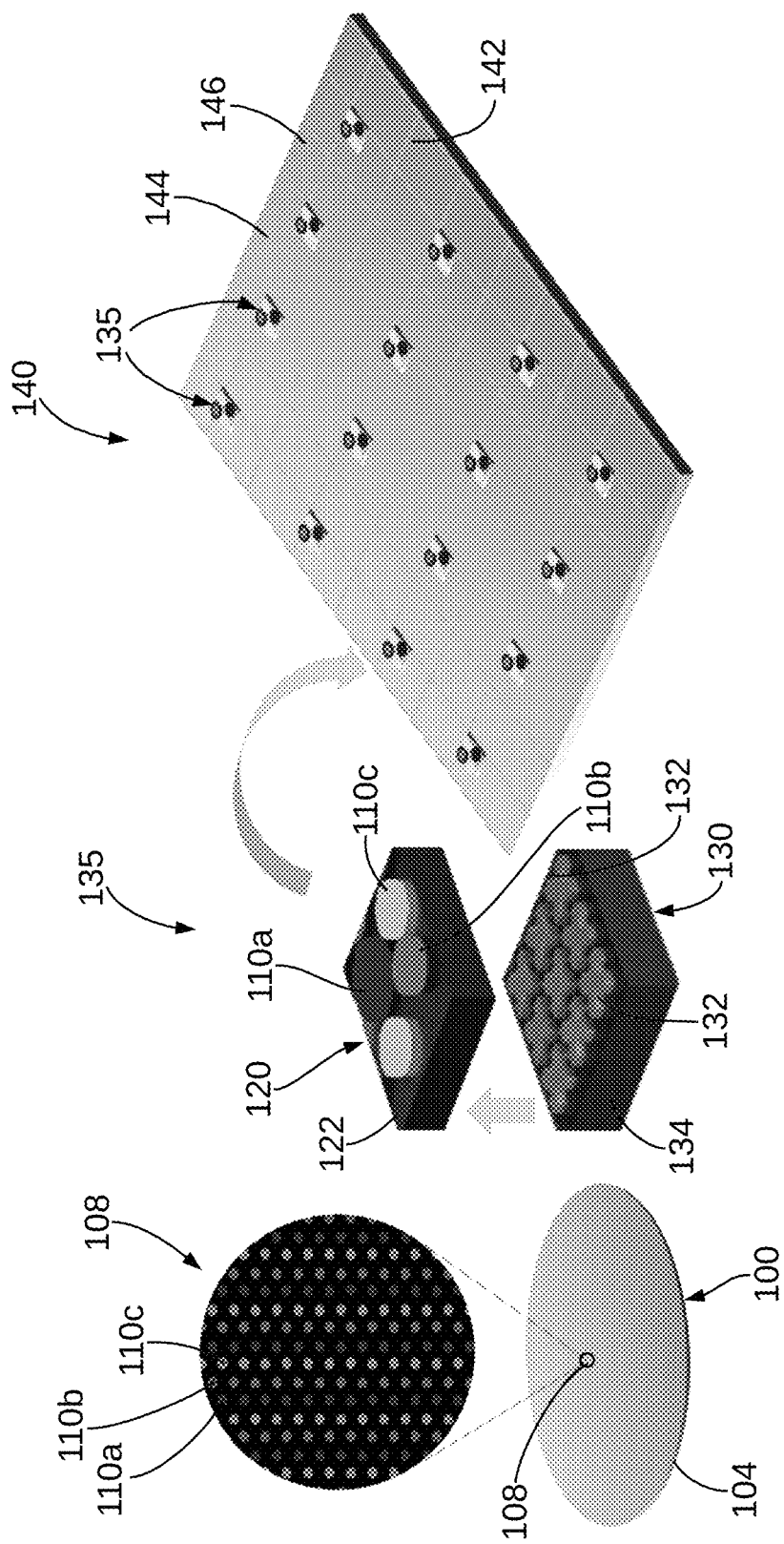
FIG. 1 illustrates a display system configuration, in accordance with an embodiment.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features.

Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as "between" two layers, it can be the only layer between the two layers, or one or more intervening layers may also be present.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "compromising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present. Likewise, when light is received or provided "from" one element, it can be received or provided directly from that element or from an intervening element. On the other hand, when light is received or provided "directly from" one element, there are no intervening elements present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In order to produce a high brightness auto-viewed 3D HPO display (e.g., lenticular or raster barrier-based), the pixel density should be relatively high compared to the lens size and/or aperture spacing. Additionally, the luminous flux of the display should be equal to or greater than a 2D display counterpart. Such requirements are inherently impractical and conflicting for organic light-emitting diode ("OLED") and liquid crystal-based displays ("LCDs"), as the minimum pixel size of such displays is constrained by the brightness requirements, pixel layer physics, practical circuit density limitations for the necessary thin film transistor ("TFT") or low temperature polycrystalline silicon ("LTPS") backplane circuitry and, in the case of LCDs, the basic need for a backlight for each pixel. For instance, for existing displays, these constraints, plus the TFT and LTPS scale constraints limit the size of a red-green-blue ("RGB") pixel to approximately 30 microns by 30 microns (e.g., the Premium OLED display on the Sony Xperia Z5 phone), approximately 50 microns by 50 microns (e.g., the Liquid Retina display on the Apple iPhone 11), up to approximately 110 by 110 square microns (e.g., the Retina display on the Apple MacBook).

While the use of complementary metal-oxide-silicon ("CMOS") backplanes can provide much higher density pixel-driving circuitry, beyond 10,000 pixels per square inch, silicon-based CMOS backplanes are more expensive than TFT or LTPS backplanes. It would not be cost effective to tile a large-scale LC or OLED display panel with a CMOS backplane. Furthermore, the mechanical tolerancing in the alignment of the high-density display pixels with respect to lenslets or apertures can be problematic. The lenslets or apertures are generally separately formed from the display pixels in large sheets using, for example, injection molding, extrusion, or printing techniques, and applied to the display pixels using for example, pressure-sensitive adhesives. All of these processes are subject to inherent limits on mechanical tolerancing on the order of several tens of microns. If the number of pixels behind each lens/aperture is limited and the ratio between the lens/aperture size and pixel size is in the single digits, then undesired artifacts related to misalignments between the lens/aperture and pixels cannot be compensated by calibration or by software. These problems are exacerbated by the usually large areas of displays compared to pixel and lens/aperture size, as tolerance errors accumulate from one side of the display to the other or from center to edge during manufacture. Combined with such manufacturability, brightness, and driving circuitry limitations, the path for producing high surface resolution, high angular resolution, and high brightness HPO auto-viewed 3D displays using existing technologies is difficult.

In contrast, inorganic micro light emitting diodes (microLEDs) are able to produce high luminance from small emission areas, and have been demonstrated as a viable display pixel source. See, for example, International Patent Publication Number WO 2019/209945 A1, WO 2019/209957 A1, and WO 2019/209961 to He et al., all of which are incorporated herein by reference in their entirety. Emission flux from a single microLED emitter has been demonstrated to be orders of magnitude higher than an even larger area OLED device, and, similarly, higher than emission flux that is practically achievable with a transmissive LC and a backlight. Thus, the advent of smaller, higher density, brighter, and higher-efficiency emissive pixels allow unique solutions to the problems described above.

Whereas the size limit of visually-discernable pixels at a typical arm's length working distance is considered to be approximately 150 microns (i.e., corresponding to approximately 1 arcmin/pixel), a microLED provides extremely bright light emission at a fraction of the dimensions. For instance, a 10 micron by 10 micron square microLED can emit up to 1000× the luminous flux of a 10,000 square micron OLED or LC pixel (e.g., 500,000 nits compared to 500 nits). That is, the emitters within a microLED display may be spaced such that a full color red-green-blue (RGB)

pixel unit can be located within a smaller pitch than 3 microns, where all three colors can be simultaneously and fundamentally emitted. Thus, even while maintaining an overall pixel size of 10,000 square microns, the microLED light emission area required is much smaller than for an OLED or LC pixel while similarly providing retinal-limited resolution and even higher luminous flux.

Taking advantage of the characteristics of microLEDs as described above, a new configuration for an auto-view HPO 3D display is disclosed. FIG. 1 illustrates the concepts related to a display system incorporating microLEDs, in accordance with an embodiment. As shown in FIG. 1, a microLED emitter array 100 includes a plurality of microLEDs supported on a wafer 104. As shown in an inset 108, microLEDs 110A, 110B, and 110C are arranged in an array, with each microLED having a pitch ranging from on the order of approximately ten microns and down to the sub-micron level. For instance, microLEDs having emitter pitch on the order of a few microns and providing light emission in the visible wavelength ranges at high brightness (i.e., on the order of hundreds of thousands of nits) have been demonstrated. MicroLEDs 110A, 110B, and 110C may each emit light energy that is different from each other in wavelength. For example, microLED 110A may emit in a red wavelength range, microLED 110B may emit in a blue wavelength, and microLEDs 110C may emit in a green wavelength range. It is noted that, while microLEDs of similar colors are shown arranged in rows within inset 108, the microLEDs may be arranged in other configurations, such as in pairs, clusters, and other suitable formations for specific applications without departing from the scope hereof.

Continuing to refer to FIG. 1, a portion of microLED emitter array 100 is isolated as a cluster, or "raxel" 120. Raxel 120 may be created, for example, by dicing microLED array 100 into multiple raxels. As shown in FIG. 1, raxel 120 includes one each of microLEDs 110A and 110B, and two of microLEDs 110C, supported on a substrate portion 122 of wafer 104. Raxel 120 is then electronically connected with a micro integrated circuit (microIC) 130. MicroIC 130 includes a plurality of interconnects 132 supported on a backplane portion 134 such that, when connected with raxel 120, microIC 130 may be used to electrically drive each one of microLEDs 110A, 110B, and 110C. When raxel 120 is electrically connected with microIC 130, together they form a "chiplet" 135 having an overall pitch on the order of ten microns or less.

Finally, a plurality of chiplets 135 can be transferred to a display backplane to form a microLED display 140, a portion of which is shown in FIG. 1. MicroLED display 140 includes a plurality of horizontal and vertical bus lines 142 and 144, respectively, supported on a display backplane 146. For instance, since each chiplet 135 has a pitch on the order of ten microns or less, the distance between chiplets 135 may be 50 to 100 microns for the pixel size to remain within under the 150 micron size limit discussed above, while providing high brightness emission at one or more wavelengths, requiring simplified electronic connections, and leaving room on display backplane 146 for additional components, such as sensor elements and other small electronic or optical elements. Furthermore, microlenses or other optical elements, which are optically coupled with light emitting pixels in a display for steering light from light emitting pixels to a desired location, have dimensions on the order of a hundred microns. Hence, the optical alignment of such optical elements with respect to chiplet 135 is simplified compared to conventional displays in which the light emitting element takes up most of the pixel real estate. Similarly, artifacts due to shadowing or edge effects resulting from the edges of microlenses or optical elements obscuring portions of microLEDs 110 are eliminated, since microlenses or optical elements may readily cover chiplet 135.

While FIG. 1 shows a raxel 120 being diced from a dense array 100 of microLEDs, raxel 120 may alternatively be formed by transferring each one or a group of microLEDs from microLED array 100 onto substrate portion 120. In an example, microLED array 100 may include microLEDs emitting at different wavelengths, as shown in FIG. 1, or all emitting at a single wavelength.

Figure 2:
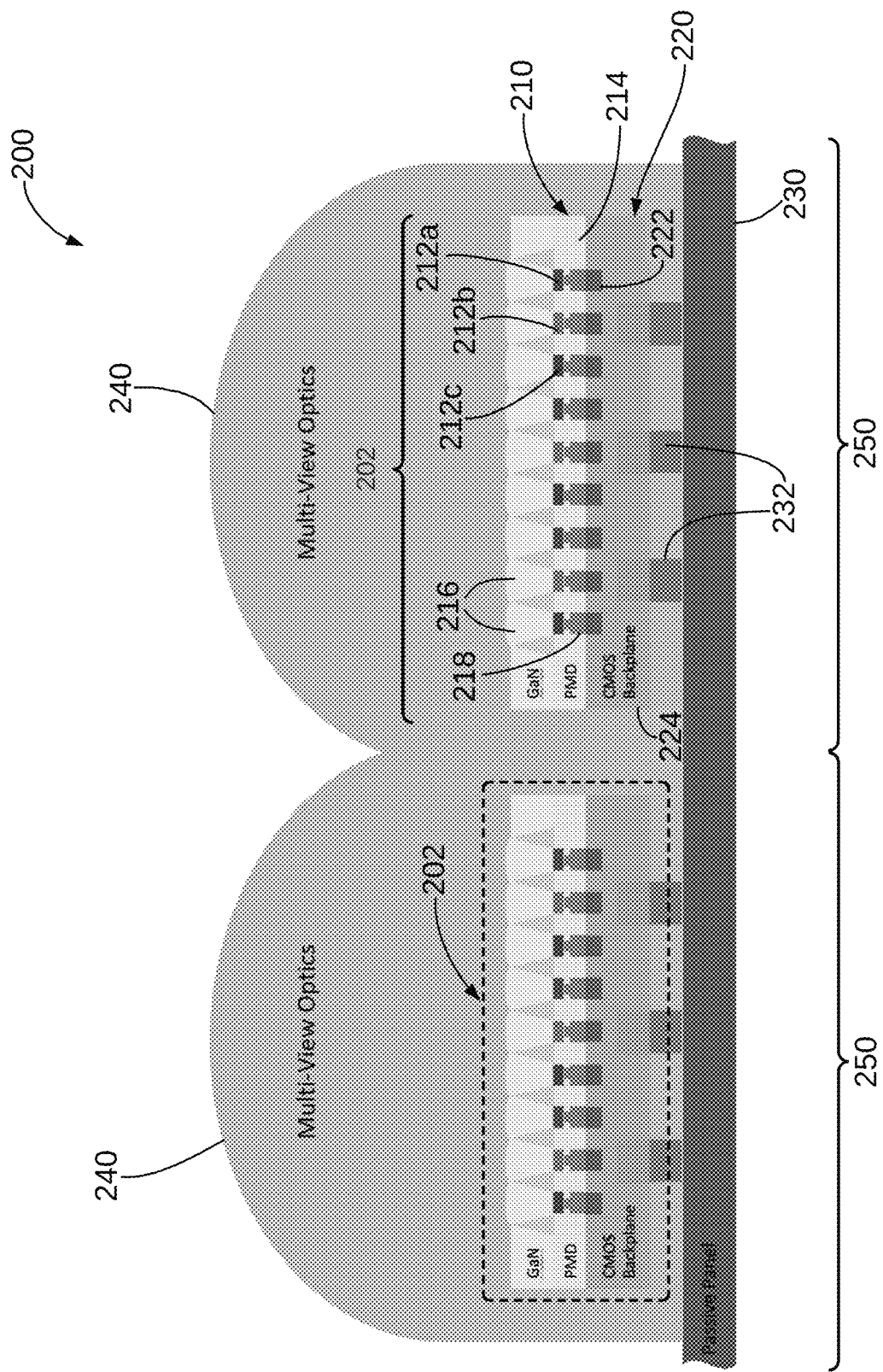
FIG. 2 illustrates a display system pixel configuration including an alternative architecture, in accordance with an embodiment.

The concept of chiplets, e.g., chiplet 135 is extended in an embodiment shown in FIG. 2. As shown in FIG. 2, a portion of a display 200 includes chiplets 202. Each chiplet 202 includes a raxel 210, which in turn includes a plurality of microLEDs 212A, 212B, and 212C supported on a substrate portion 214. It is noted that rather than four microLEDs as shown in FIG. 1, each raxel 210 includes multiple microLEDs arranged in row(s), as will be described in further detail in FIG. 3 below. MicroLEDs 212A, 212B, and 212C are respective examples of microLEDs 110A, 110B, and 110C. Raxel 210 is an example of raxel 120.

Continuing to refer to FIG. 2, each of microLEDs 212A, 212B, and 212C emits light, which may be collected and re-directed by structures such as light cones 216. Each one of microLEDs 212A, 212B, and 212C includes an electrical connector 218, which is used for connecting electronically with a microIC 220 via an interconnect 222. Interconnects 222 are supported on a backplane portion 224. Chiplet 202 is then connected to a display backplane 230 via connectors 232. Connectors 232 may be conductive or nonconductive bonds, for example. Each chiplet 202 is overlaid with multi-view optics 240 configured for cooperating with the chiplet for directing light emission from the chiplet to a desired location. The combination of chiplet 202 and multi-view optics 240 forms a pixel 250, as shown in FIG. 2.

Figures 3, 4:
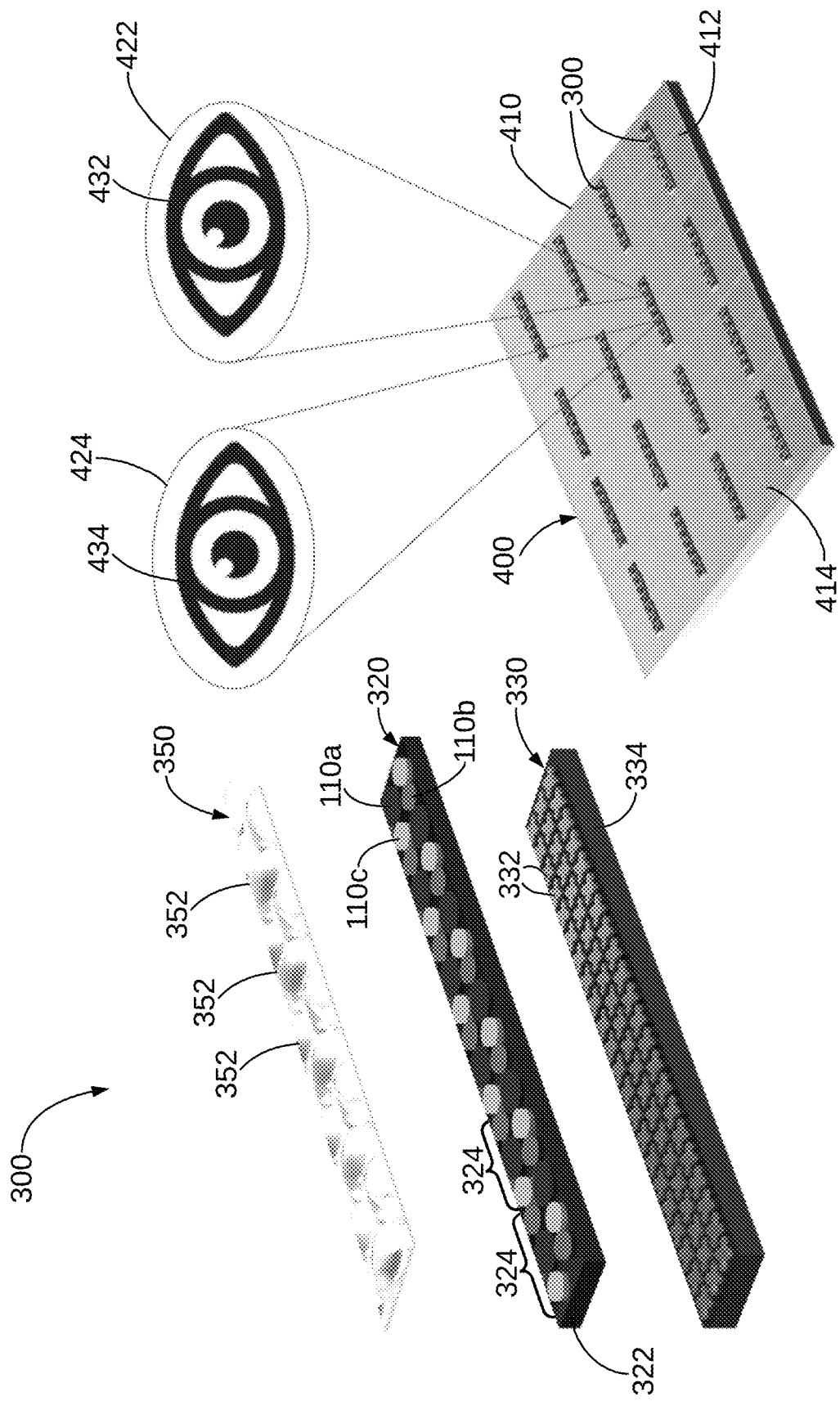
FIGS. 3 and 4 illustrate an alternative display system configuration, in accordance with an embodiment.

Further details of an example of a chiplet used in combination with a microlens array is shown in FIG. 3, in accordance with an embodiment. As shown in FIG. 3, a chiplet 300 includes a raxel 320, which includes a plurality of microLEDs (such as microLEDs 110A, 110B, and 110C from FIG. 1) supported on a substrate portion 322. In the example shown in FIG. 3, two rows of seventeen microLEDs are arrayed in raxel 320, forming multiple sub-raxels 324. Raxel 320 is configured for electronically connecting with a microIC 330, which in turn includes a plurality of interconnects 332 supported on a backplane portion 334. Raxel 320 is an example of raxel 210.

Additionally, chiplet 300 as shown in FIG. 3 includes a microlens array 350 configured for optical alignment with raxel 320. Microlens array 350 includes a plurality of microlenses 352, In an example, each one of microlenses 352 may be configured for optical alignment with one of the microLEDs in raxel 320. Alternatively, each one of microlenses 352 may be sized and aligned to cover each one of sub-raxels 324. For instance, microlens array 350 may be bonded to raxel 320 such that chiplet 300 includes integrated microlenses thereon. It is noted that microlenses 352 may be physically and functionally distinct from conventional lenslets or optical steering elements that are used for segregating light from different sub-raxels 324 to form distinct views. That is microlenses 352 may be considered part of chiplet 300, while a separate set of lenslets may be provided for forming the multiple views formed by an overall 3D display.

Referring now to FIG. 4, a portion of a display 400 includes a plurality of chiplets 300 supported on a display backplane 410. Display backplane 410 includes a plurality of horizontal and vertical bus lines 412 and 414, respectively, such that the portion of display 400 shown includes a four-by-four array of pixels, each pixel including one chiplet 300. Each one of chiplets 300 is driven by horizontal and vertical bus lines 412 and 414, respectively, for contributing one of multiple views produced by display 400, such as first and second views 422 and 424, respectively, which are displayed at right and left eyes 432 and 434 respectively using for example, additional lenses or optical steering elements (not shown).

In an embodiment, each microLED emitter has a pixel pitch on the order of a few microns (e.g., less than 10 microns, less than 5 microns, or less than 3 microns), raxel 320 is supported on an equally small CMOS backplane for addressing each microLED, and each chiplet is as small as 10 microns by 60 microns in area. The resulting chiplet 300 may include circuitry to interface with an addressing array on a display backplane (e.g., horizontal and vertical bus lines 412 and 414, respectively) using a specific communication protocol. Alternatively, each chiplet 300 may be configured to be addressable by simpler TFT or LTPS display drive circuitry, thus greatly reducing the cost and complexity of the resulting display over a comparable OLED or LC display. In some embodiments, drive circuitry may include one or more of decompression circuits, interpolator circuits, parallax sequencing circuits, or other circuits configured to provide processing functionality. Additionally, the remaining area of display backplane 410 that is not covered by chiplets 300 may be populated with additional electronic or optical components, such as sensors or transistors.

Figure 5:
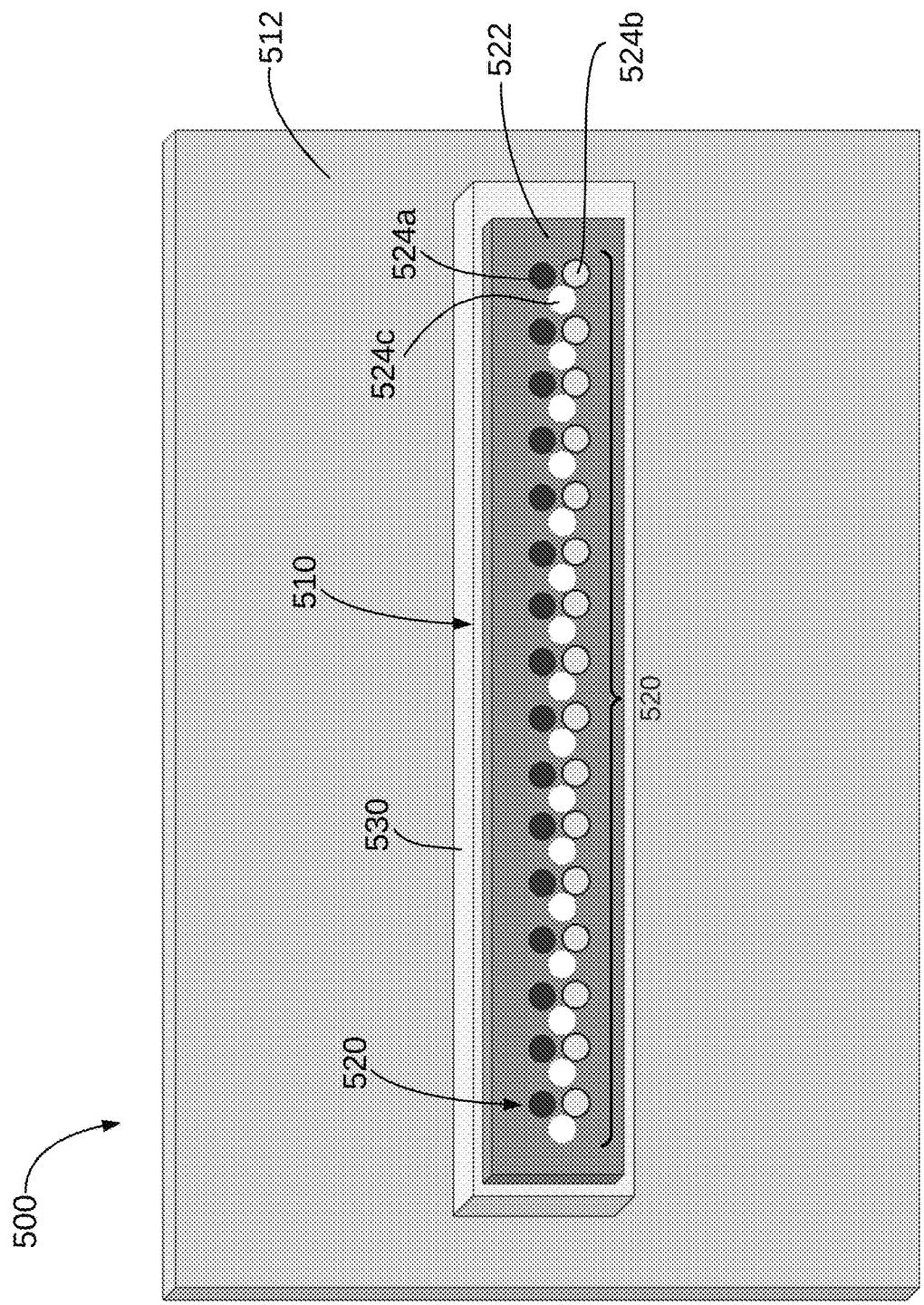
FIGS. 5 and 6 illustrate still another variation of the display system pixel configuration, in accordance with an embodiment.

An alternative layout of a chiplet is shown in FIG. 5, in accordance with an embodiment. As shown in FIG. 5, a pixel cell 500 includes a chiplet 510 supported on a display back plane 512. Chiplet 510 includes a raxel 520, which in turn includes a substrate portion 522 supporting a plurality of microLEDs 524A, 524B, and 524C thereon. Raxel 520 is an example of raxel 320. Although each one of microLEDs 524A, 524B, and 524C is shown as emitting a different color of light in FIG. 5, other configurations of microLEDs are possible, such as where all of the microLEDs emit a single color, just two colors, or they emit a particular color, which is converted to additional wavelengths using color converter arrangements (not shown). Raxel 520 is electrically coupled with a microIC 530 (interconnects and other components of microIC 530 are not visible in FIG. 5).

Figure 6:
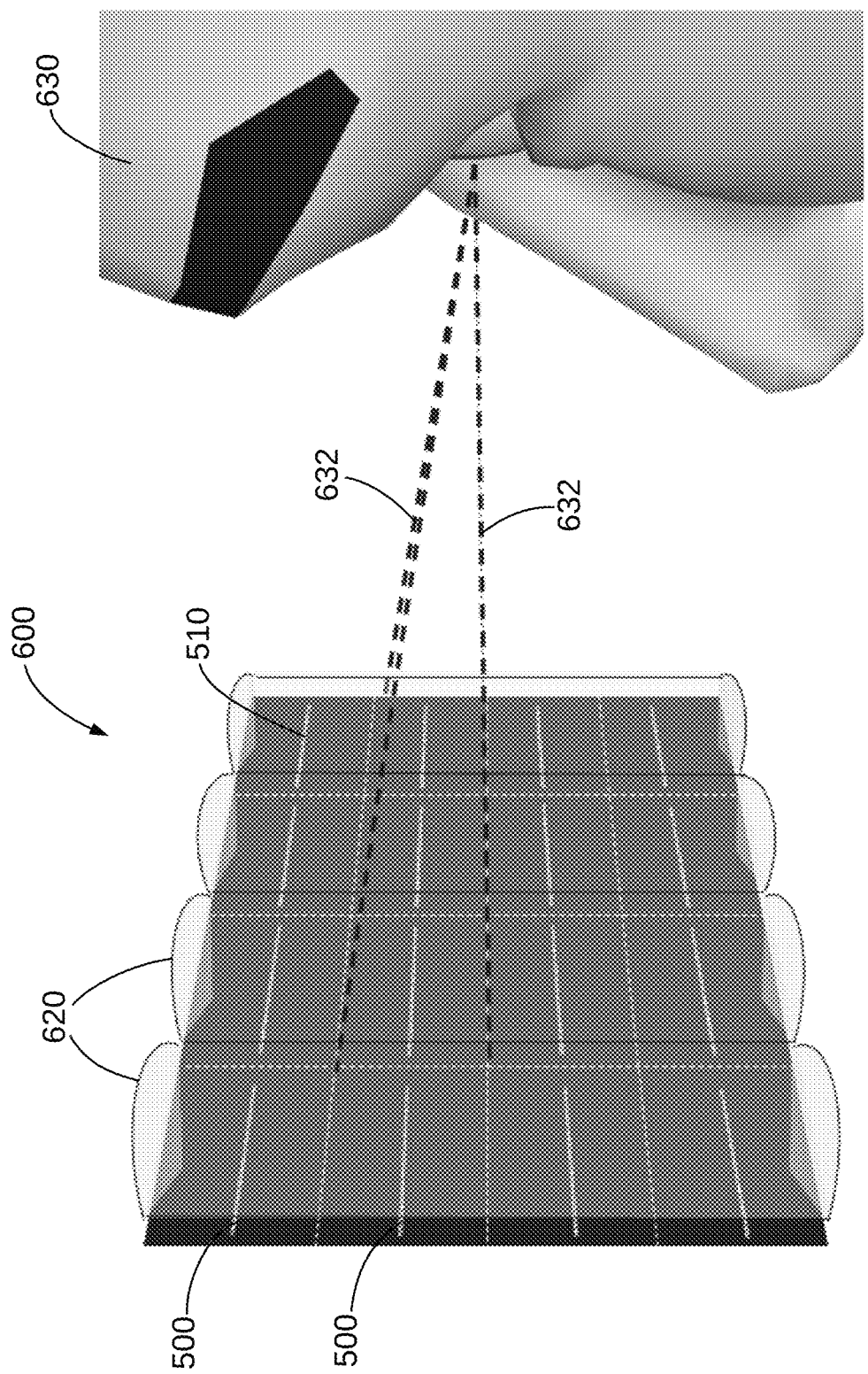

FIG. 6 illustrates an application of pixel 500 of FIG. 5, in accordance with an embodiment. A magnified portion of a display 600 is shown in FIG. 6. The portion of display 600 shown in FIG. 6 includes a four-by-four array of pixel cells 500. In the embodiment shown in FIG. 6, display 600 further includes an array of cylindrical lenslets 620 overlaid over each pixel cell column of display 600, thus providing horizontal-only parallax viewing by uniquely mapping raxel light to distinct angles radiating in the horizontal direction. Alternatively, cylindrical lenslets 620 may be replaced with or combined with parallax barriers, which may serve a similar function as the cylindrical lenslets. Thus, each pixel cell 500 contributes to a view as seen by a viewer 630 and represented by rays 632.

In an embodiment, each pixel cell 500 has dimensions of 150 microns by 150 microns or smaller such that the pixel cell spans approximately one arcmin or less when viewed at a working distance of 500 millimeters away. Since the width of each lenslet 620 is below the perception limit of viewer 630 and the microLED emitters on each chiplet 510 are even smaller than the width of each lenslet 620, display 600 is capable of generating a plurality of directionally distinct output fields. Thus, display 600 operates to provide a surface resolution percept that is equivalent to state-of-the-art 2D display, with the ability to portray high quality, auto-viewed 3D images.

Figure 7:
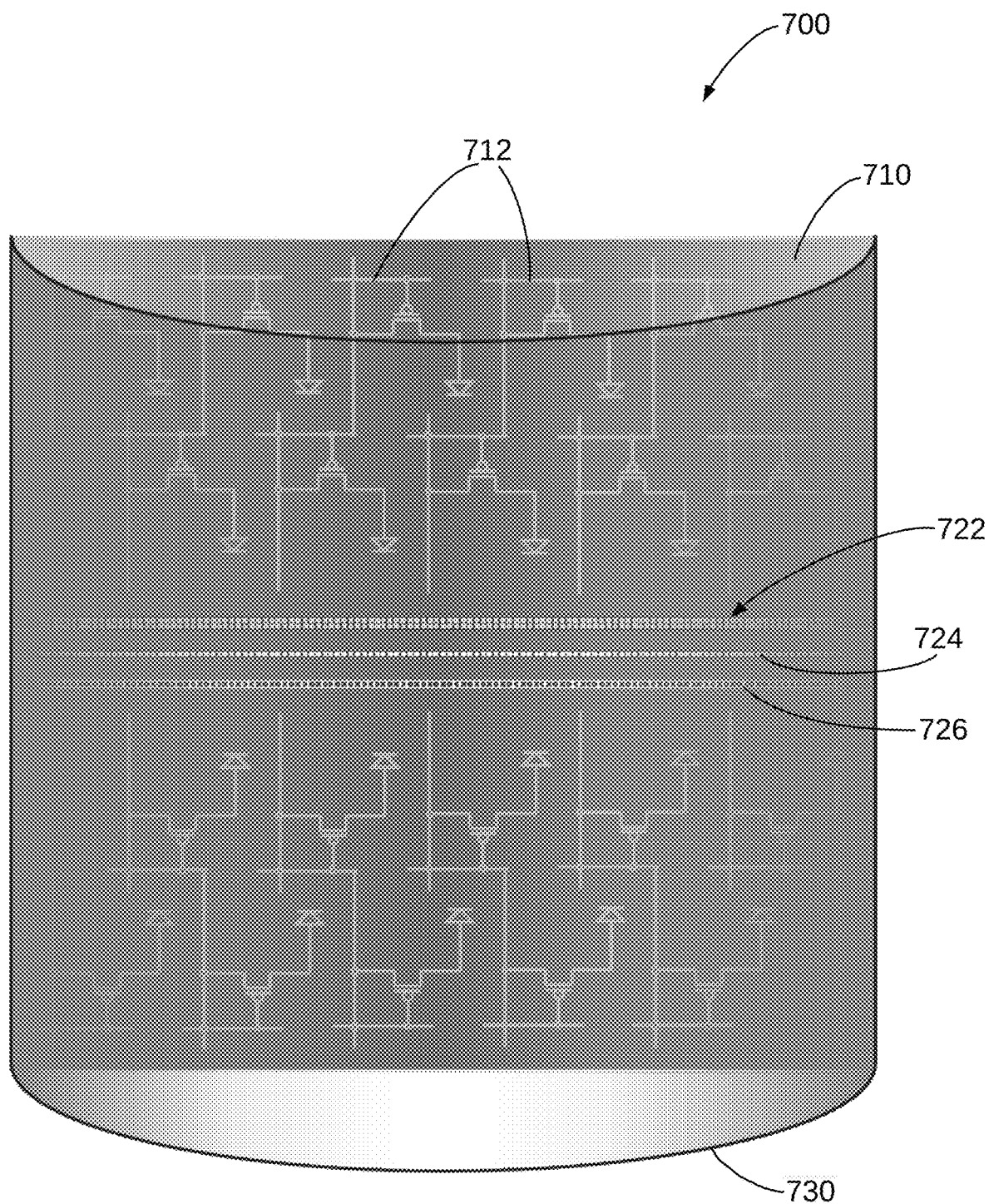
FIGS. 7-10 illustrate additional variations of the display system pixel configuration, in accordance with further embodiments.

Alternative pixel configurations using linear chiplets similar to those shown in FIGS. 5 and 6 are discussed with reference to FIGS. 7-10. FIG. 7 shows a pixel 700 including a backplane 710 supporting circuitry 712 thereon. It is noted that, while circuitry 712 are intended to represent the general concept of electronic components supported on backplane 710, and are not representative of specific circuit schematics in components or size. Pixel 700 also includes monochromatic first, second, and third chiplets 722, 724, and 726, respectively. Each one of first, second, and third chiplets 722, 724, and 726 may be separately formed and coupled with backplane 710. As an example, first chiplet 722 includes two rows of microLEDs emitting in a red wavelength range. Second chiplet 724 includes a row of microLEDs emitting in a green wavelength range, and third chiplet 726 includes a row of microLEDs emitting in a blue wavelength range. First chiplet 722 includes the additional row of red-emitting microLEDs, for example, to compensate for the lower efficiency and brightness commonly exhibited by red microLEDs in comparison to green- or blue-emitting microLEDs currently available. Pixel 700 is overlaid with a portion of a cylindrical lenslet 730 for directing light from pixel 700 to a desired location to contribute to a portion of the multiple views provided by the overall display including pixel 700.

Figure 8:
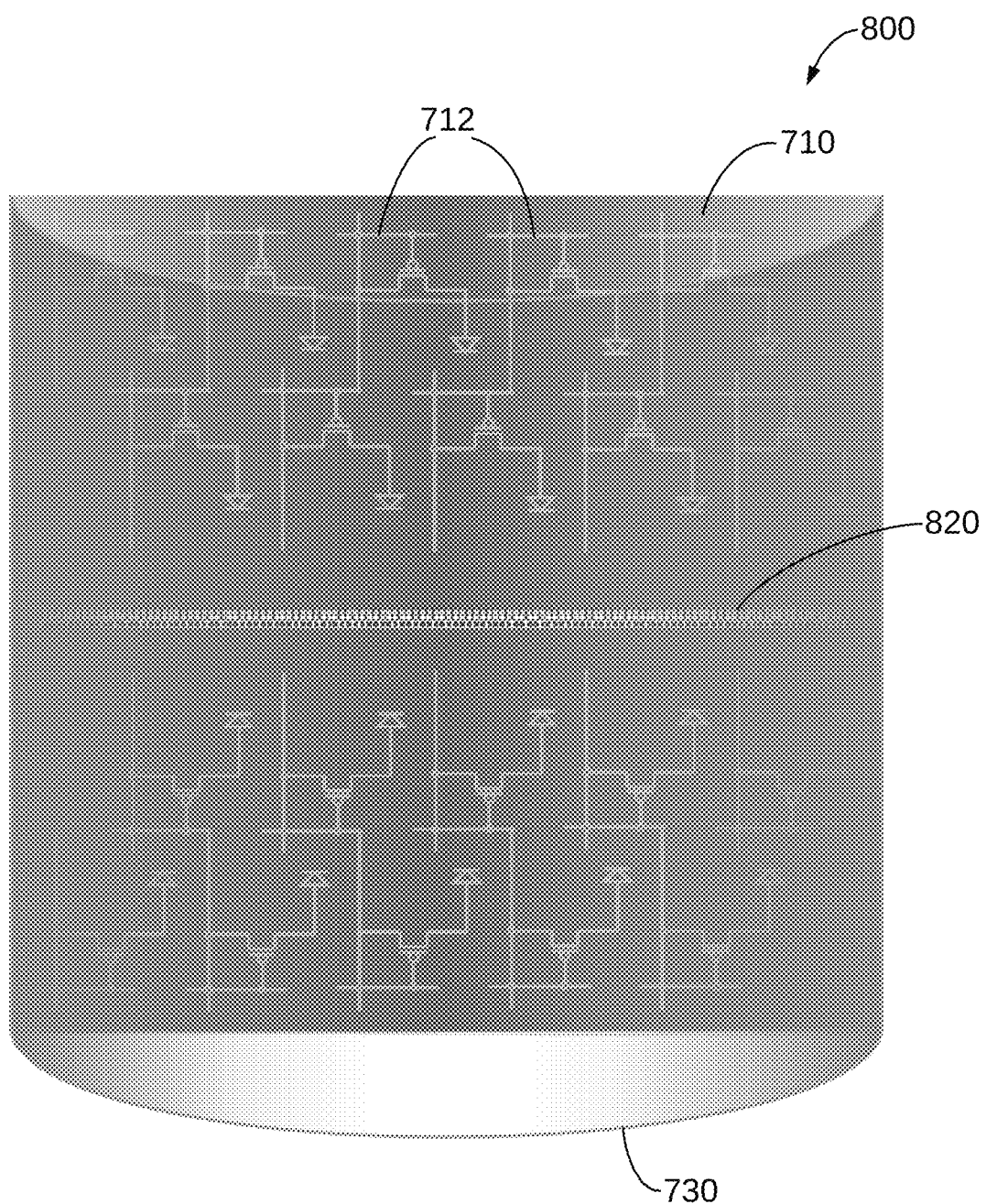

FIG. 8 shows another variation of a pixel using a linear chiplet. As shown in FIG. 8, a pixel 800 includes many of the same components as pixel 700 of FIG. 7 where, again, circuitry 712 is representative, not specific, in terms of electronic components that may be supported on backplane 710. Pixel 800, however, includes a trichrome chiplet 820, which includes three rows of microLEDs, each row of microLEDs emitting in a particular wavelength range such that each vertical column of microLEDs provides three different colors of light emission. This columnar arrangement is distinct from the hexagonal packed structure illustrated in FIG. 5, and may enable higher density packing of the emitters as well as, optionally, variable spacing between the colors. All three rows of microLED emitters, in this case, are driven as a single chiplet.

Figure 9:
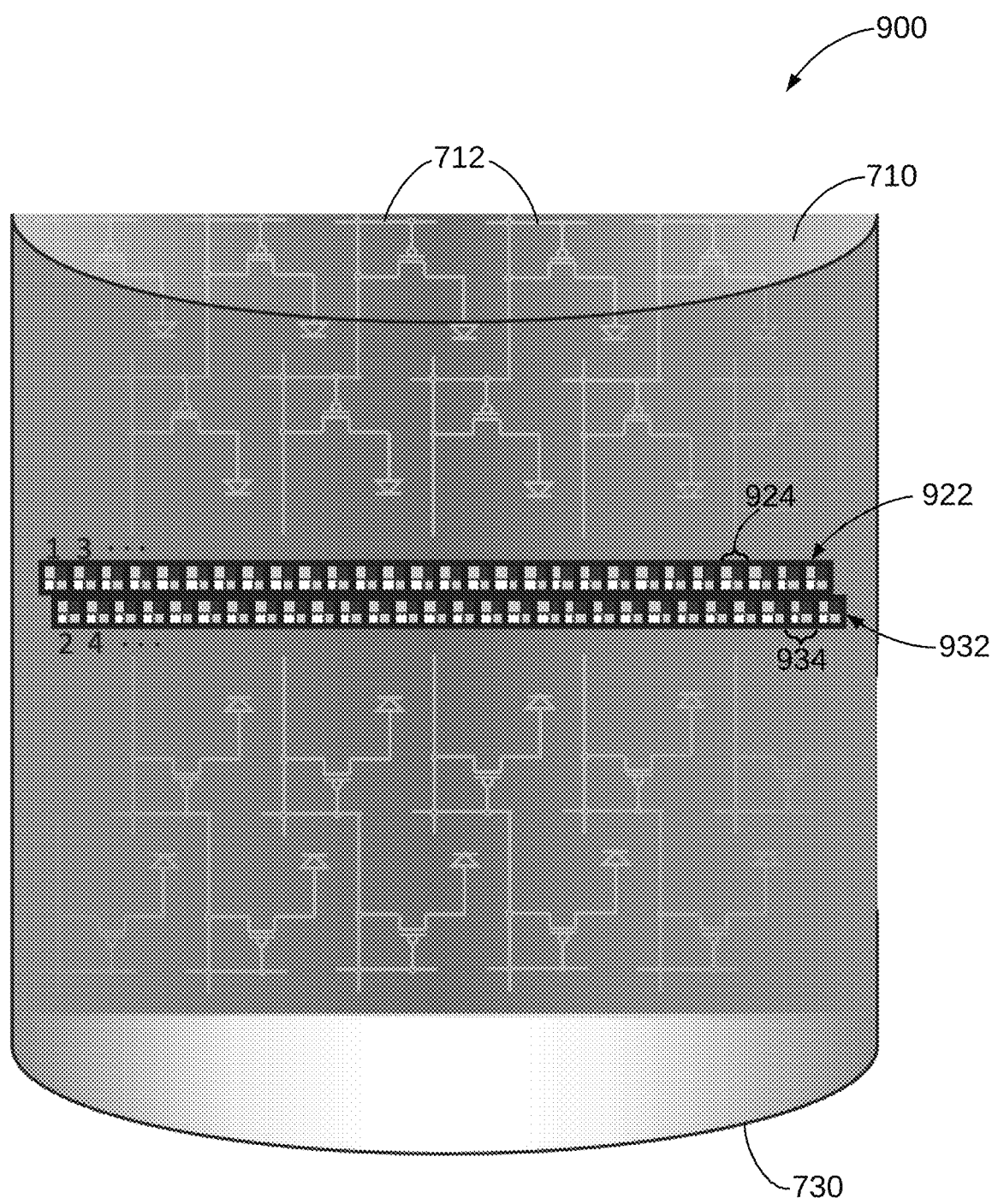

FIG. 9 illustrates another variation of the linear chiplet pixel, configured here to increase the density of distinct parallax output fields. Once again, circuitry 712 shown in FIG. 9 are intended to represent the general concept of electronic components supported on backplane 710, not to indicate specific circuit schematics in components or size. As shown in FIG. 9, a pixel 900 includes a first chiplet 922, including two rows of trichrome microLEDs forming a row of sub-raxels 924. Sub-raxel 924 is an example of sub-raxel 324 of FIG. 3. In the example shown in FIG. 9, each sub-raxel 924 includes at least one microLED emitting light in a red wavelength range, at least one microLED emitting light in a green wavelength range, and at least one microLED emitting light in a blue wavelength range. While FIG. 9 shows a two-by-two array of microLEDs, other layouts and combinations of light emissions are possible.

Figure 10:
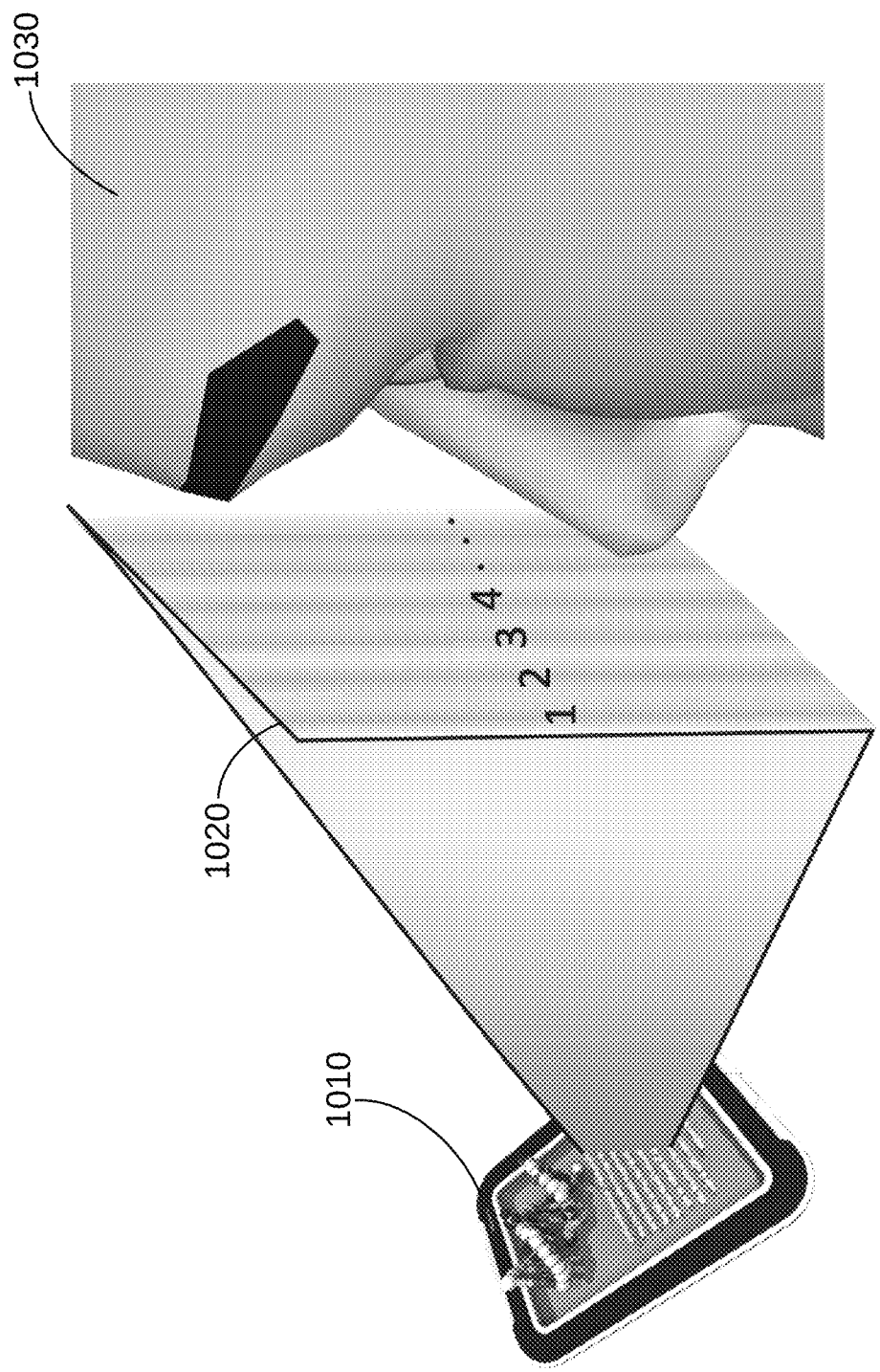

Continuing to refer to FIG. 9 in combination with FIG. 10, pixel 900 further includes a second chiplet 932, also including two rows of trichrome microLEDs forming a row of sub-pixels 934. Second chiplet 932 is offset from first chiplet 922 by half of a sub-pixel, as shown in the example in FIG. 9. In an example, the left-most sub-pixel of first chiplet 922 is configured for providing a left-most portion of a view, the left-most sub-pixel of second chiplet 932 is configured for providing the second left-most portion of a view, and so on as shown in FIG. 10. That is, if a display device 1010 is formed of a plurality of pixels 900, then a view 1020 seen by a viewer 1030 is a combination of views 1, 2, 3, 4 . . . (shown in FIG. 10 forming view 1020) as provided by sub-pixels 1, 2, 3, 4 . . . (shown as numbers adjacent to sub-pixels 924 and 934 corresponding to first and second chiplets 922 and 932, respectively). In this way, the resultant parallax views provided by each of first and second chiplets 922 and 932, respectively, can be interlaced such that the horizontal parallax sampling is increased beyond pixel pitch limits, thus producing a higher angular resolution for a given pixel pitch by two chiplets as compared to that achievable with a single chiplet. A similar approach may be applied to parallax barrier-based display systems incorporating chiplets therein.

Figure 11:
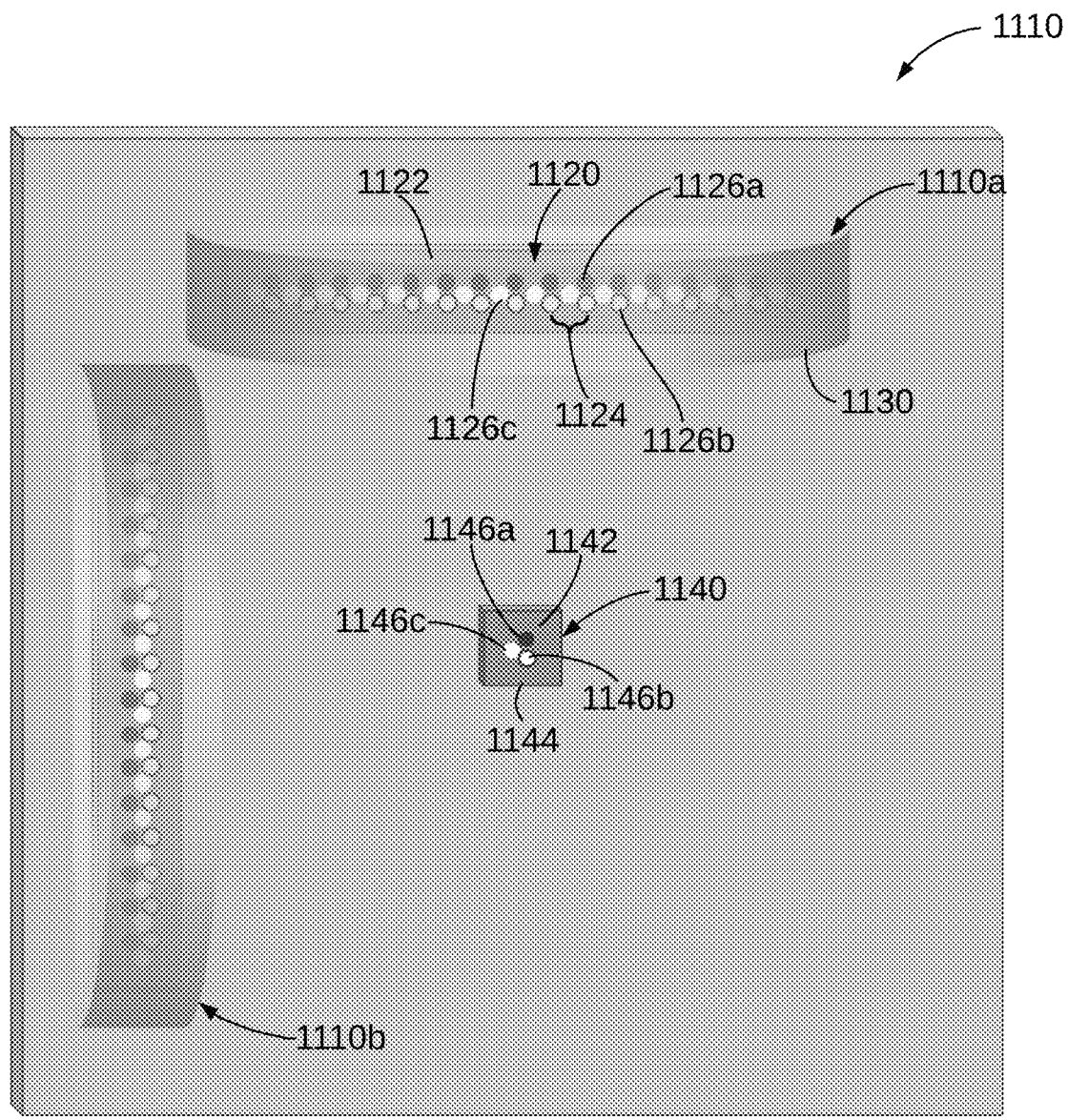
FIG. 11 illustrates another alternative embodiment of the display system pixel configuration.

A further variation of the chiplet concept is shown in FIG. 11. As shown in FIG. 11, a pixel 1100 includes first and second chiplets 1110A and 1110B, respectively. First chiplet 1110A is horizontally oriented along a top edge of pixel 1100, and includes a raxel 1120. Raxel 1120 is an example of raxel 120 of FIG. 1. Raxel 1120 is electrically coupled with a microIC (not visible in FIG. 11) as discussed above. Raxel 1120 includes a substrate portion 1122 supporting a row of sub-raxels 1124 thereon. Each sub-raxel 1124 includes first, second, and third microLEDs 1126A, 1126B, and 1126C, respectively. In the example shown in FIG. 11, first, second, and third microLEDs 1126A, 1126B, and 1126C emit light at different wavelength ranges, such as in the red, green, and blue wavelength ranges as an example. First chiplet 1110A is overlaid with a lens 1130. Alternatively, a parallax barrier may be provided in place of or in addition to lens 1130. Second chiplet 1110B includes essentially the same components as first chiplet 1110A, and is oriented vertically along a left edge of pixel 1100, as shown in the exemplary embodiment of FIG. 11.

The orthogonal orientation of first and second chiplets 1110A and 1110B, respectively, enables pixel 1100 to provide horizontal-only parallax 3D views even when the display is rotated. For example, if a display device incorporating an array of pixels 1100 also includes a gyroscope, the display device may only use first chiplet 1110A when the display device is being held in a first position and, when the display device senses it has been turned by 90-degrees into a second position, then the display device deactivates first chiplet 1110A and activates second chiplet 1110B. Such a feature would be applicable, for example, for a cellphone or a tablet to be able to provide auto-view horizontal-only parallax views when the device is being held in a portrait or landscape mode.

Additional real estate available in pixel 1100 may be used in a variety of ways. In an embodiment, pixel 1100 of FIG. 11 further includes a single RGB emitter 1140. Single RGB emitter 1140 includes a substrate portion 1142 supporting a sub-pixel 1144. While substrate portion 1142 is shown as a square, other shapes (e.g., hexagonal) may be used for specific applications. Sub-pixel 1144 includes a first microLED 1146A emitting light in a red wavelength range, a second microLED 1146B emitting light in a green wavelength range, and a third microLED 1146C emitting light in a blue wavelength range. Single RGB emitter 1140 may be used, for example, for display of standard (i.e., no parallax) 2D image and thus does not require multi-view optics integrated thereon. Single RGB emitter 1140 may be used in the display of a 2D image when the display device incorporating pixel 1100 is not being used to display a 3D image. Alternatively, both 3D and 2D modes may be simultaneously activated such that a 2D image may be presented on the surface of the display device while a 3D image or a particular portion of the 2D image may be presented as a 3D object floating above or below the surface of the display device. Also, additional electronic or optical components may be incorporated into the available areas of pixel 1100. For instance, one or more sensors may be incorporated into pixel 1100 to perform tasks such as brightness sensing, motion sensing, depth sensing, and head/eye/gaze tracking.

An alternative display architecture incorporating the chiplet concept is illustrated in FIGS. 12-14. As shown in FIG. 12, a portion of a display 1200 includes a plurality of lenslets 1210 arranged in adjacent columns. Rather than being supported on a display backplane, a plurality of chiplets 1220 are attached directly to each lenslet 1210. The array of lenslets 1210 also includes signal-conducting bus lines 1230 embedded between the optically active regions of lenslets 1210 and connected to each chiplet 1220 via branch conductors 1232. Bus lines 1230 and branch conductors 1232 may be, for example, embedded within lenslets 1210 or printed on a surface of the array of lenslets 1210 using screen printing, metal deposition, or other suitable methods. Laterally-adjacent chiplets may be offset from each other as illustrated in FIG. 12, or aligned, as illustrated in FIG. 6.

A side cross-sectional view of a portion of lenslet 1210 incorporating a chiplet 1220 is shown in FIG. 13. As shown in FIG. 13, chiplet 1220 may be held in place by mounting features 1310, as an example. Mounting features 1310 may be clip-like features configured for securely accommodating at least a portion of chiplet 1220 therein, and may be molded during the fabrication process of lenslet 1210, or added after the fabrication of lenslet 1210. Mounting features 1310 may also incorporate electronic wiring for connecting chiplet 1220 with branch conductors 1232.

A top cross-sectional view of a different portion of the array of lenslets 1210 is shown in FIG. 14. As shown in FIG. 14, chiplets 1220 are attached to lenslets 1210 and electrically accessed via conductive bus lines 1230. As an illustrative example, a first portion of upper chiplet 1220, as shown in FIG. 14, emits light, represented by solid arrows 1410, that is directed downward in the figure by the curvature of lenslet 1210. Similarly, a different second portion of the same upper chiplet 1220 emits light, represented by dashed arrows 1412, that is directed upward in the figure by the curvature of lenslet 1210, thus providing a different view from the first portion of upper chiplet 1220 and resulting in horizontal-only parallax views.

In the arrangement illustrated in FIGS. 12-14, the array of lenslets 1210 (i.e., the optical layer) becomes the structural element of the display device, without requiring a display backplane, thus enabling thinner display. Further, this architecture promotes higher precision alignment of chiplets 1220 with their associated optical elements, resulting a reduction of optical aberrations and image artifacts. Additionally, optical emission fields may be more effectively isolated from pixel to pixel, thus reducing display crosstalk and further enhancing the image quality. Moreover, manufacturability of the display device may be improved, for example, by constructing each row of lenslets as strips integrating the chiplets and branch conductors therein, then assembling the display device column by column from the strips. Those familiar with the art will appreciate that this same scheme can be used with the integration of parallax barriers, rather than lenslets, or a combination of the two.

Figures 15, 16:
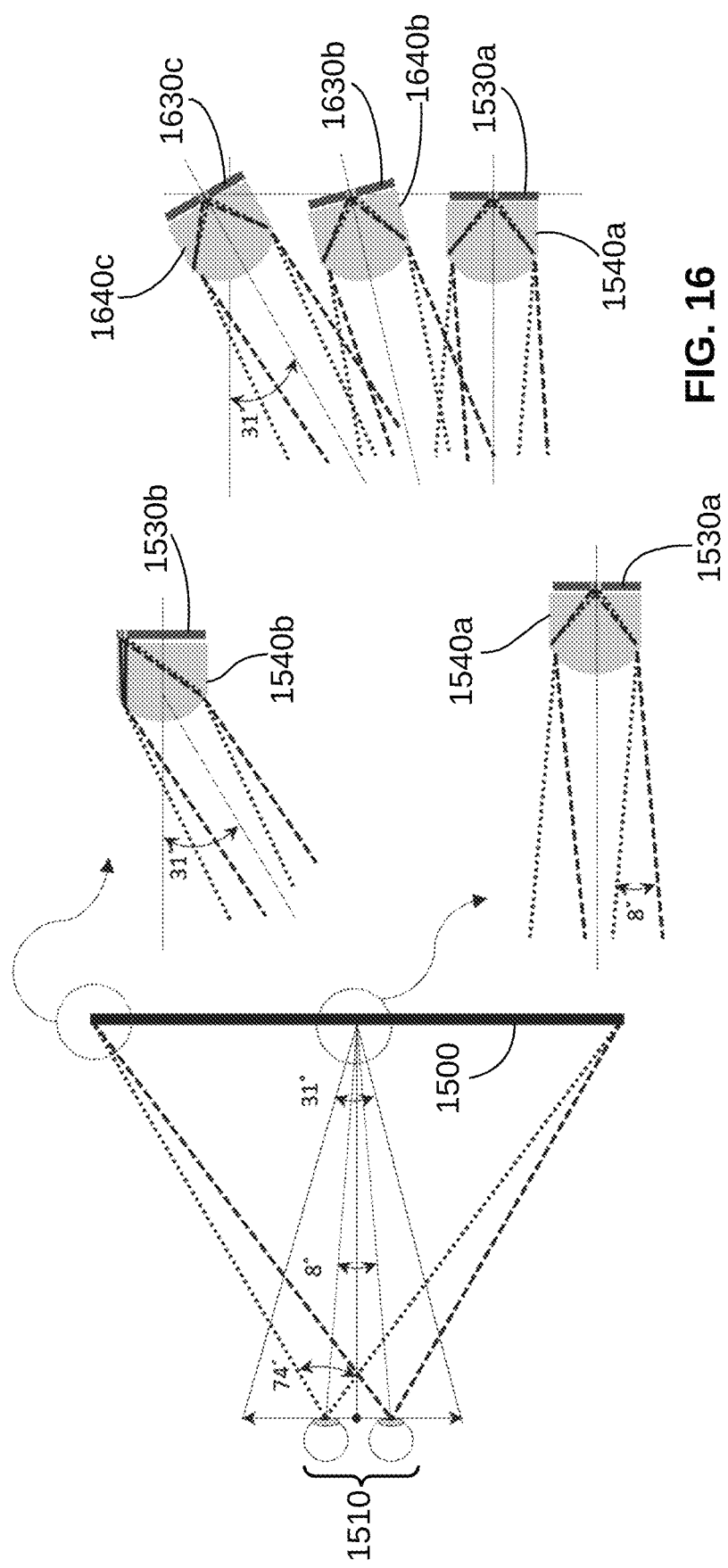
FIGS. 15-17 illustrate additional display system configurations, in accordance with further embodiments.

Another arrangement of such integration of chiplets directly with lenslets is illustrated in FIGS. 15 and 16. As shown in FIG. 15, a flat display 1500 provides horizontal-only parallax views to a viewer 1510. Flat display 1500 includes chiplets 1530 supported by columns of lenslets 1540. In the middle of flat display 1500, where viewer 1510's eyebox is perpendicularly aligned with flat display 1500, a chiplet 1530A reliably provides parallax views with low aberration. However, near the edges of flat display 1500, extreme off-axis operation of the display will likely lead to visual artifacts and optical aberrations in the views presented to viewer 1510, for example, when chiplet 1530B and lenslet 1540B are still aligned with the plane of flat display 1500.

In contrast, if the flat display were formed of strips of lenslets integrating chiplets therein that are assembled column by column, as discussed above, then the orientation angle of each column of lenslets (and accordingly the orientation angle of the chiplets integrated therein) may be adjusted from the center of the display to the edges in order to mitigate the aberrations that result from the display architecture illustrated in FIG. 15. For instance, as shown in FIG. 16, a chiplet 1630B and lenslet 1640B, located closer to the center of the display, may be rotated toward the central axis by some amount, a chiplet 1630C integrated into a lenslet 1640C near an edge of the flat display may be further rotated toward a central axis of the display (e.g. by 31-degrees), and so on. By rotating the lenslet columns, and their associated chiplets, such that each lenslet faces the center of the desired eyebox, then edge effects and other optical aberrations may be reduced.

Figure 17:
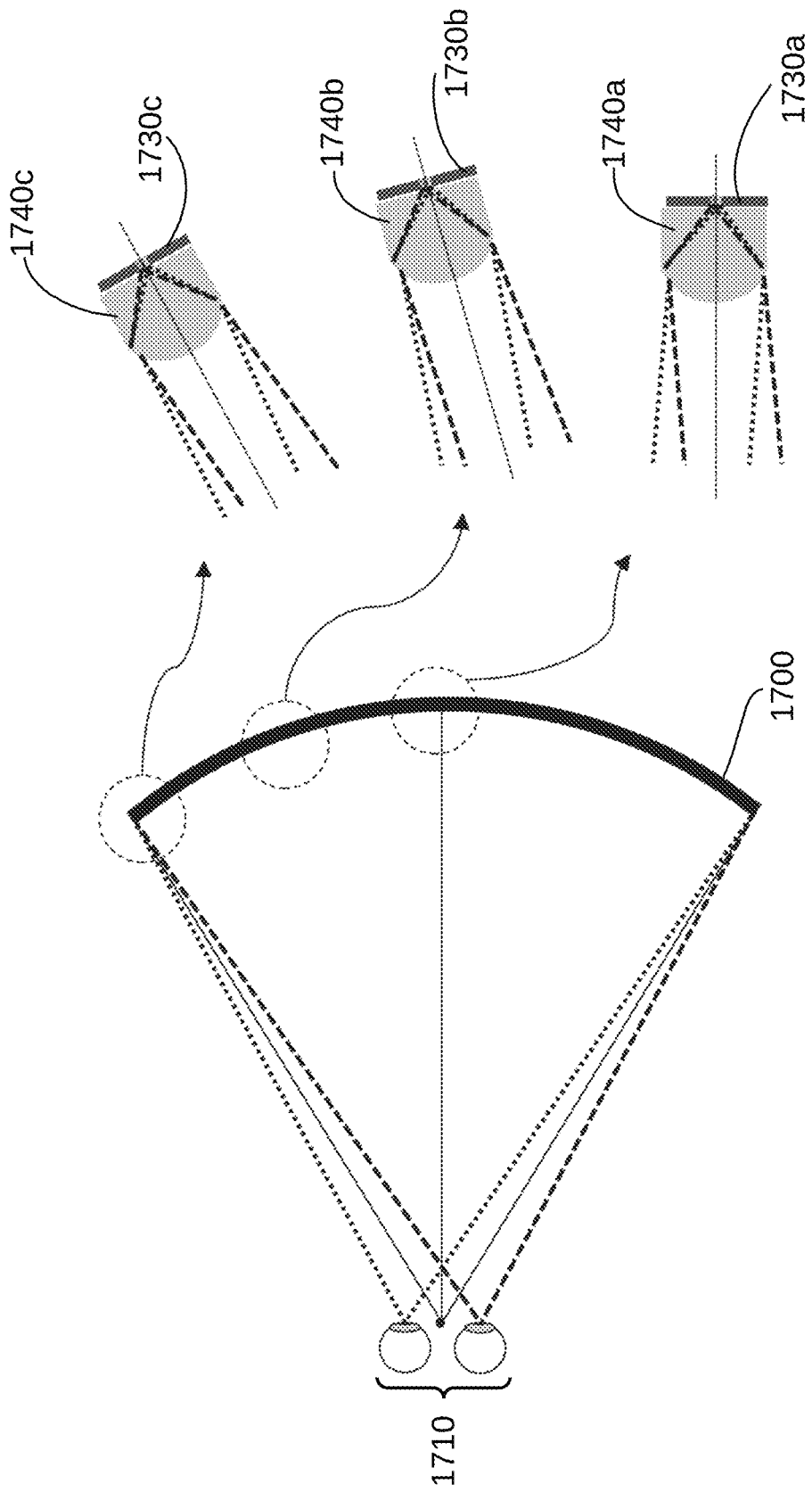

A further alternative would be to assemble the strips of lenslets integrating chiplets into a curved display. As shown in FIG. 17, a curved display 1700 is configured to provide horizontal-only parallax views to a viewer 1710. Within curved display 1700, the curvature of the display is such that the lenslets, and consequently the chiplets integrated therein, are curved toward the eyebox of viewer 1710 as shown.

Another display architecture is illustrated in FIGS. 18-20, shown here to illustrate an alternative type of lenslets and a conformally-curved emitter strip. For example, a Luneburg lens with a graded refractive index varying from center to perimeter, is designed with conjugate foci at infinity and, at the surface of the lens, produces high quality transforms. As shown in FIG. 18, a lenslet portion 1800 includes a gradient-index Luneburg-type cylindrical lenslet 1810 with curved chiplets 1820 integrated thereon.

A top cross-sectional view of lenslet portion 1800 is shown in FIG. 19. As shown in FIG. 19, lenslet 1810 is supported by a pre-formed bed 1910, which also includes conductive bus lines 1920 for electrically coupling with curved chiplets 1820. Due to the refractive properties of the Luneburg lens, light from different portions of curved chiplet 1820 produce collimated output emerging from the opposite surface as represented by light rays 1950 and 1955. Alternatively, curved chiplets 1820 may instead be integrated into pre-formed bed 1910 so as to conformally contact lenslet 1810 as shown in FIG. 19. Further, as shown in FIG. 20, multiple lenslets 1810 may be arranged in columns to form a display. Each of curved chiplets 1820 may be addressed for instance, via bus lines 2010. This Luneburg approach would have the advantage of providing much larger fields of view due to the high quality optical performance effected by the Luneburg lenses over large angles. This approach would also likely provide relative simplicity, in terms of optical components, in the manufacturing process.

While the above discussion focused on the consideration of lenslet or lenticular-based displays, it is recognized that the discussions are also readily applicable to parallax/raster barriers and aperture-based displays. The microLED chiplet approach for providing auto-viewed 3D displays fundamentally separates the large pixel bed of the display from the parallax-generating optics sheet by discretizing individual pixel cell emitters into their own modules. This approach in conjunction with high speed, high resolution pick-and-place assembly systems or monolithically integrated microLED fabrication, enables heretofore unavailable display structural and system architectures. The ratios between the size and pitch of the pixels, the size and pitch of the lenslet, the field of view (or distribution angle) of the lenslet, and the focal length of the lenslet may be adjusted and optimized for each display application, such as for small form factor wearable displays to ultra high resolution displays and large scale displays. Also, the positioning of the emitters within chiplets can be varied to meet the needs of the specific display system. For instance, nonlinear spacing of parallax views or compensation for optical distortion due to the lenslets may be achieved by appropriate microLED layout schemes.

Various alternative or additional configurations or components may be implemented in one or more of the optical systems described above. Accordingly, many different embodiments stem from the above description and the drawings. It will be understood that it would be unduly repetitious and obfuscating to literally describe and illustrate every combination and subcombination of these embodiments. As such, the present specification, including the drawings, shall be construed to constitute a complete written description of all combinations and subcombinations of the embodiments described herein, and of the manner and process of making and using them, and shall support claims to any such combination or subcombination.

What is claimed is:

1. A display system comprising:
   a plurality of chiplets including a chiplet including a plurality of micro light emitting diodes aligned along a direction,
   the chiplet having a width dimension orthogonal to the direction that is greater than a height dimension aligned along the direction;
   a display backplane subdivided into a plurality of pixel cells, at least one of the plurality of pixel cells is configured to supports the chiplet from the plurality of chiplets; and
   a steering element optically coupled to the chiplet and configured to steer light along a first portion of the direction from a first portion of the chiplet and along a second portion of the direction from a second portion of the chiplet.

2. The display system of claim 1, wherein the plurality of micro light emitting diodes is arranged in a micro light emitting diode array having a micro light emitting diode pitch between adjacent micro light emitting diodes less than 10 microns.

3. The display system of claim 1, wherein the plurality of chiplets is configured in a two-dimensional grid of chiplets having a chiplet pitch between adjacent chiplets that is less than 150 microns.

4. The display system of claim 1, further comprising:
   a sensor disposed on a portion of the display backplane between adjacent chiplets of the plurality of chiplets, the sensor includes at least one of a brightness sensor, a motion sensor, a depth sensor, an eye sensor, and a gaze tracking sensor.

5. The display system of claim 1, wherein the steering element is included in a steering-element array that has a steering-element pitch between adjacent steering elements less than 150 microns.

6. The display system of claim 1, wherein the steering element is a lenslet.

7. The display system of claim 6, wherein the lenslet has a width dimension of approximately 100 microns.

8. The display system of claim 1, wherein at least one pixel cell of the plurality of pixel cells included in the display backplane supports a first chiplet of the plurality of chiplets and a second chiplet of the plurality of chiplets.

9. The display system of claim 1, wherein the plurality of micro light emitting diodes includes red emitter, a green emitter, and a blue emitter.

10. The display system of claim 1, wherein the steering element includes a cylindrical lens.

11. The display system of claim 1, wherein the steering element includes a parallax barrier.

12. The display system of claim 1, wherein at least one of the plurality of pixel cells spans one arcmin or less when viewed from a distance of 500 millimeters.

13. The display system of claim 1, wherein the plurality of pixel cells includes a pixel pitch less than 150 microns.

14. The display system of claim 1, wherein the steering element is configured to define parallax views.

15. The display system of claim 1, wherein the plurality of chiplets is a first plurality of chiplets, the direction is a first direction, the plurality of micro light emitting diodes is a first plurality of micro light emitting diodes, the display system further comprising:
a second plurality of chiplets including a second plurality of micro light emitting diodes aligned along a second direction non-parallel to the first direction.

16. The display system of claim 15, wherein the steering element is a first steering element, the second plurality of chiplets are optically coupled to a second steering element.

17. The display system of claim 15, wherein the first direction is orthogonal to the second direction.

18. A display system comprising:
a plurality of chiplets including a chiplet including a plurality of micro light emitting diodes aligned along a line, the chiplet having a width dimension orthogonal to the line that is greater than a height dimension aligned along the line;
a display backplane subdivided into a plurality of pixel cells, at least one of the plurality of pixel cells is configured to support the chiplet; and
a steering element optically coupled to the chiplet and configured to steer light along a first portion of the line from a first portion of the chiplet and along a second portion of the line from a second portion of the chiplet.

19. The display system of claim 18, wherein the chiplet is electrically coupled to a micro integrated circuit backplane, the micro integrated circuit backplane is electrically coupled to the display backplane.

20. A display system comprising:
a plurality of chiplets including a chiplet including a plurality of micro light emitting diodes aligned along a line, the chiplet having a width dimension orthogonal to the line that is greater than a height dimension aligned along the line;
a display backplane subdivided into a plurality of pixel cells, at least one of the plurality of pixel cells is configured to support the chiplet; and
a steering element optically coupled to the chiplet and configured to steer an emission from a first micro light emitting diode of the plurality of micro light emitting diodes at a first angle and an emission from a second micro light emitting diode of the plurality of micro light emitting diodes along a second angle different from the first angle.

21. The display system of claim 20, wherein the emission from the first micro light emitting diode and the emission from the second micro light emitting diode correspond to parallax views.

* * * * *